(12) United States Patent
Webb et al.

(10) Patent No.: US 10,727,777 B2
(45) Date of Patent: Jul. 28, 2020

(54) SYSTEM AND APPARATUS FOR GENERATING ELECTRICITY WITH INTEGRATED CIRCUITRY

(71) Applicant: Qingdao Austech Solar Technology Co. Ltd, Qingdao, Shandong (CN)

(72) Inventors: Roger Clyde Webb, New South Wales (AU); Maria Anna Webb, New South Wales (AU)

(73) Assignee: Qingdao Austech Solar Technology Co. Ltd (CN)

( * ) Notice: Subject to any disclaimer, the term of this patent is extended or adjusted under 35 U.S.C. 154(b) by 0 days.

(21) Appl. No.: 16/335,645

(22) PCT Filed: Sep. 18, 2017

(86) PCT No.: PCT/AU2017/051012
§ 371 (c)(1),
(2) Date: Mar. 21, 2019

(87) PCT Pub. No.: WO2018/053579
PCT Pub. Date: Mar. 29, 2018

(65) Prior Publication Data
US 2019/0341876 A1    Nov. 7, 2019

(30) Foreign Application Priority Data

Sep. 22, 2016   (AU) ................................ 2016903823

(51) Int. Cl.
*H02S 10/30*         (2014.01)
*H02S 40/32*         (2014.01)
(Continued)

(52) U.S. Cl.
CPC .............. *H02S 10/30* (2014.12); *H01L 35/30* (2013.01); *H02J 3/385* (2013.01); *H02S 40/32* (2014.12); *H02S 40/425* (2014.12)

(58) Field of Classification Search
CPC ......... H01L 35/30; H02S 10/30; H02S 40/32; H02S 40/425; H02J 3/385
See application file for complete search history.

(56) References Cited

U.S. PATENT DOCUMENTS 3,696,286 A * 10/1972 Ule ........................ B64G 1/425
                                                  320/101
5,604,430 A *  2/1997 Decker ..................... G05F 1/67
                                                  323/275
(Continued)

FOREIGN PATENT DOCUMENTS

CN        201639520      11/2010
WO     WO2015188226      12/2015

*Primary Examiner* — Golam Mowla
(74) *Attorney, Agent, or Firm* — Forge IP, PLLC

(57) ABSTRACT

An apparatus for generating electricity comprises a solar panel having a plurality of photovoltaic cells and a MPPT device alone or in combination with a DC/AC inverter connected directly thereto, and a plurality of heat sink tiles and a heat exchanger. The heat sink tiles are disposed between the solar panel and the heat exchanger. The heat exchanger is connected to a circulation system which allows coolant fluid to flow through the heat exchanger. Each of the heat sink tiles having a first side in direct thermal contact with a respective one of the photovoltaic cells and an opposite second side in contact with the heat exchanger. The heat exchanger having a plurality of coolant chambers disposed adjacent to the heat sink tiles. The first heat exchanger has at least one second coolant chamber disposed adjacent to said MPPT device and/or DC/AC inverter.

7 Claims, 19 Drawing Sheets

(51) Int. Cl.
*H01L 35/30* (2006.01)
*H02J 3/38* (2006.01)
*H02S 40/42* (2014.01)

(56) References Cited

U.S. PATENT DOCUMENTS

| | | | |
|---|---|---|---|
| 6,433,522 B1 * | 8/2002 | Siri | G05F 1/67 |
| | | | 320/101 |
| 8,093,757 B2 | 1/2012 | Wolfs | |
| 2008/0147335 A1 * | 6/2008 | Adest | G01D 4/004 |
| | | | 702/64 |
| 2008/0236648 A1 * | 10/2008 | Klein | H01L 31/02021 |
| | | | 136/244 |
| 2010/0208427 A1 | 8/2010 | Horiuchi et al. | |
| 2010/0275971 A1 | 11/2010 | Zingher | |
| 2014/0306540 A1 | 10/2014 | Wu et al. | |
| 2016/0065127 A1 * | 3/2016 | Newdoll | H02S 50/00 |
| | | | 136/246 |

\* cited by examiner

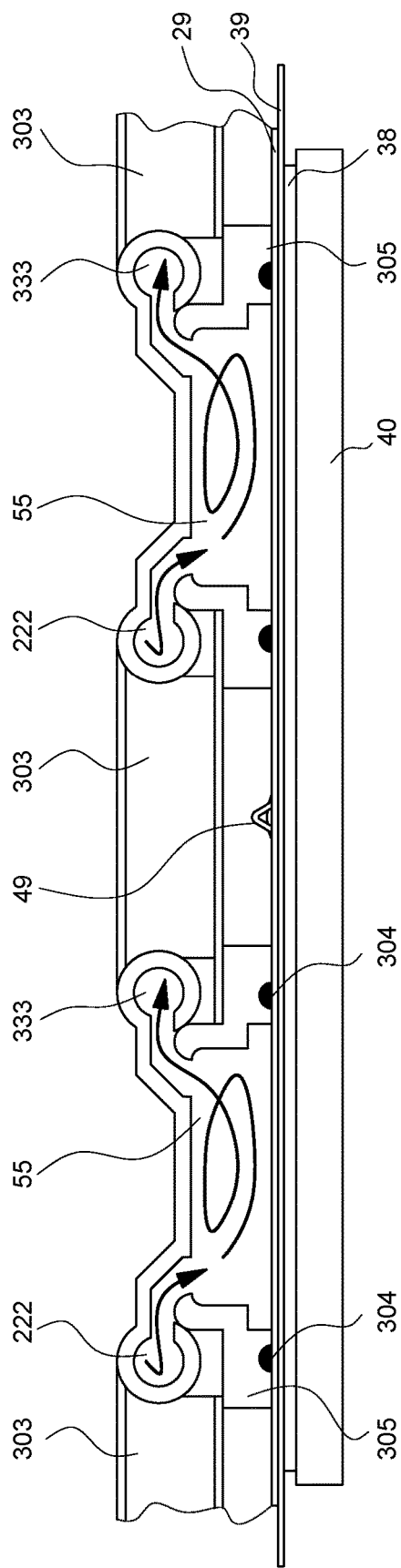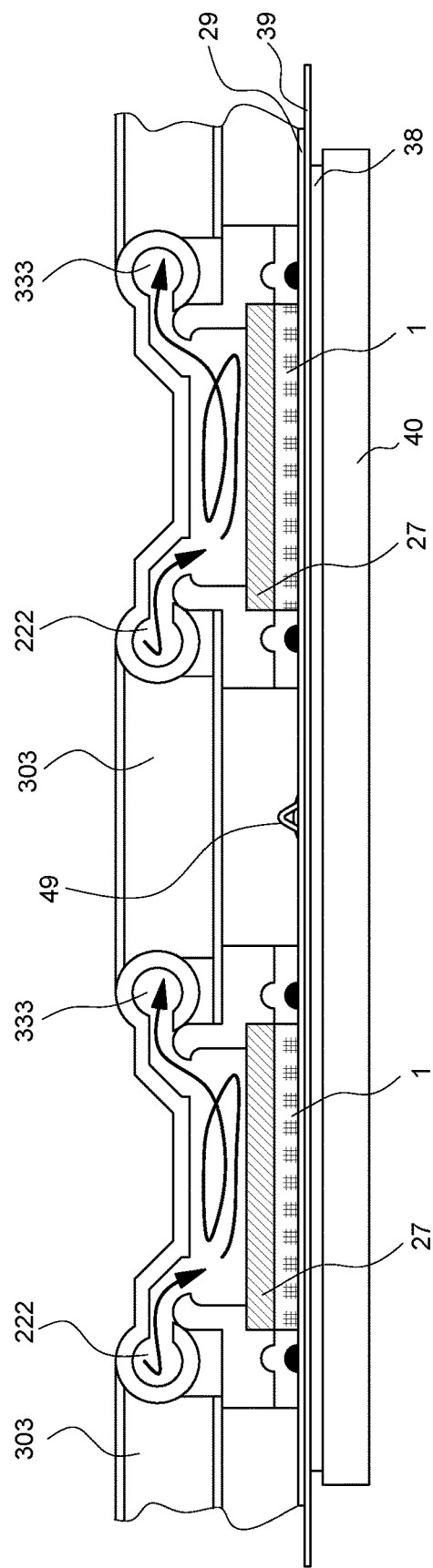

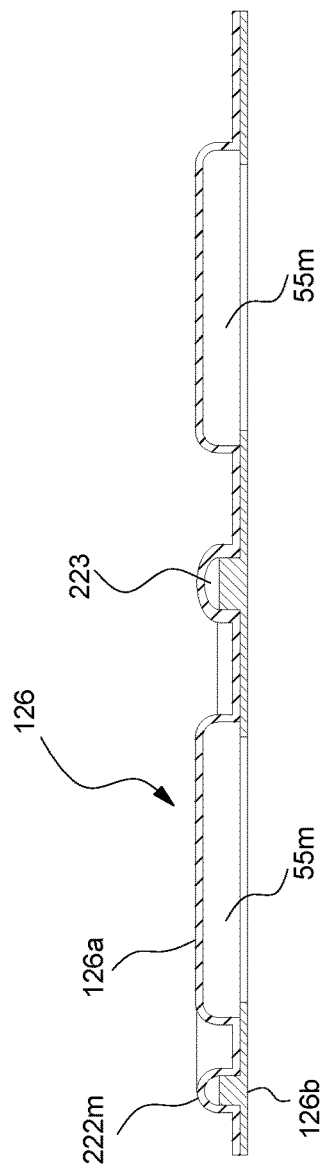
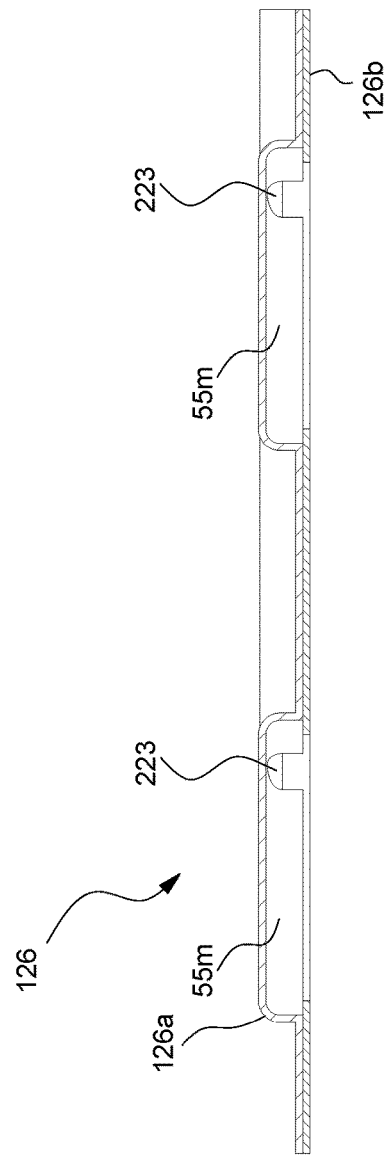

SYSTEM AND APPARATUS FOR GENERATING ELECTRICITY WITH INTEGRATED CIRCUITRY

TECHNICAL FIELD

The present invention relates to an apparatus for generating electricity. In particular, this invention is firstly directed towards a photovoltaic solar panel with closely mounted MPPT and/or inverter circuitry, in combination with heat sink tiles and a heat exchanger having coolant chambers, the latter cooling the solar panel and circuitry to assist in improving its efficiency. Secondly this invention is described with reference to a modular unit for attachment to a solar panel with closely mounted MPPT and/or inverter circuitry

BACKGROUND

A "solar panel" is a set of solar photovoltaic modules electrically connected and mounted on a supporting structure. A photovoltaic module is a packaged, connected assembly of solar cells. The solar module can be used as a component of a larger photovoltaic system to generate and supply electricity in commercial and residential applications, and as such solar panels are widely used throughout the world.

A photovoltaic system typically includes a panel or an array of photovoltaic modules, an inverter, and sometimes a battery and or solar tracker and interconnection wiring.

Each photovoltaic module is rated by its DC output power under standard test conditions, and these typically range from 100 to 320 watts. One disadvantage of a solar panel is that as the temperature of the collecting surface increases, the efficiency of the solar panel significantly decreases. A conservative estimate by manufacturers (and used by some researchers) is that every 1° C. of temperature rise corresponds to a drop in efficiency by 0.5%. Based on our testing, with standard 100 W solar panels, a more realistic estimate is that for every 1° C. of temperature rise above 25° C. in cell temperature, there is a reduction between 0.5% and 1.5% of peak output. As the cell temperature increases further, there is a larger reduction in efficiency.

A photovoltaic panel is designed to operate with DC (direct current) electrical output. DC electrical current does not travel well over long distances. For example as much as 10% of the electrical power outputted from the panels can be lost through the wiring of a normal household photovoltaic installation. In photovoltaic solar farm situations many panels are connected together in series to form a larger group to deliver and produce a higher DC voltage in an effort to reduce the losses of long distances, however, 5-8% can still be lost throughout such a system.

MPPT (Maximum Power Point Tracking) devices are used to boost output performance of solar panels. Under most conditions the output performance can only be raised by 10% approximately, but the electronic MPPT device also consumes power in its operation. Other devices commonly referred to as DC/AC inverters, such as pure sign wave grid connect or grid ties have been implemented to convert the DC current delivered from the solar panels into high voltage AC output which travels to AC more readily over long distances. Losses through large electronic equipment still occur.

Domestic and some smaller commercial solar power systems use some form of storage system and DC/AC conversion system to connect directly to the domestic grid.

All these applications result in losses of electrical energy. In the case of MPPT and grid connect devices this loss is through heat dissipation through the body of the devices and grid connect as well as internal losses. An additional offset and cost of these devices is in the heavy aluminium structure casing which is used as a heat sink to dissipate the heat. This cost must also be considered as a negative return on invest. It is known that you can harvest more power from an array of photovoltaic cells by eliminating connection in strings or reducing the length of strings by providing MPPT control to the individual or smaller number of cells. This is discussed at paragraph [0031] of US patent publication No. 2014/0306540 (Wu et al.). Such a solution is described in U.S. Pat. No. 8,093,757 (Wolfs et al.), where taking advantage of recent advances in low voltage electronics, maximum power tracking devices for very small groups of solar cells or for single cells are used to maximize power output from the array. The embodiment for Wolfs however, is primarily described with reference a solar powered vehicle, where movement of the solar powered vehicle causes some form of cooling due to air flow passing over the solar cells.

Whilst placing MPPT and inverter/grid connect devices closer to the DC output of the photovoltaic cells would improve efficiency, the downside is the temperature of such environment. In stationary solar panels of the type mounted on dwellings and buildings, photovoltaic cell temperature can be over three times that of ambient temperature. This means, that at an ambient temperature of 20° C., the cell temperature of a photovoltaic panel surface may already be over 60° C. This causes difficulties in placing MPPT and inverter/grid connect devices in close proximity to photovoltaic cells. Where solar panels are mounted in domestic and commercial situations, the MPPT and inverter devices are typically mounted downstream from the panels, and their typical operating temperatures are at about 50-70° C. at these downstream locations. To place the MPPT and inverter devices close to the high temperatures at which conventional solar panels operate, means that their internal temperature could get over 100° C., and this means their efficiency and service life is considerably compromised.

Furthermore, with conventional arrangements there is a compounding of losses. Firstly there are the losses in the photovoltaic cells panels themselves, discussed in detail in the background of our earlier patent application No. PCT/AU2015/050309 filed 5 Jun. 2015, and secondly you have the additional losses of the downstream positioning of MPPT devices and/or DC/AC inverter/grid connect devices.

One way of addressing this is to mount MPPT and "inverter/grid connect' devices close to the DC output of the solar panel, and provide cooling thereto. However, any energy gain of placing the MPPT and inverter/grid connect devices closer to the DC output must be considered against the energy expended to cool such devices. As such there has not been any commercially viable cooling solutions, so the practice in the prior art has been to typically locate MPPT and inverter devices significantly downstream of the array of solar panels requiring lengthy DC cabling and its associated losses.

The present invention seeks to provide an apparatus for generating electricity that will ameliorate or overcome at least one of the deficiencies of the prior art.

SUMMARY OF INVENTION

According to a first aspect the present invention consists in an apparatus for generating electricity comprising:

a solar panel having a plurality of photovoltaic cells and a MPPT device alone or in combination with a DC/AC inverter connected directly thereto;

a plurality of first heat sink tiles; and a first heat exchanger;

wherein said first heat sink tiles are disposed between said solar panel and said first heat exchanger, and said first heat exchanger is connected to a circulation system which is adapted to allow coolant fluid to flow through said first heat exchanger, and each of said first heat sink tiles having a first side in direct thermal contact with a respective one of said photovoltaic cells and an opposite second side in contact with said first heat exchanger, and said first heat exchanger having a plurality of first coolant chambers disposed adjacent to said first heat sink tile, and said first heat exchanger has at least one second coolant chamber disposed adjacent to said MPPT device and/or DC/AC inverter.

Preferably a second heat sink is disposed between said second coolant chamber and said MPPT device and/or DC/AC inverter.

Preferably said MPPT device and/or DC/AC inverter are disposed in a housing in said first heat exchanger.

Preferably at least a portion of said heat exchanger is made of plastic and said housing is integrally formed therein.

Preferably the output of said DC/AC inverter is a pure sine wave inverter.

Preferably the output AC current from said inverter, is connected in series to the output AC current of a like apparatus.

Preferably said apparatus is connected directly to an AC grid.

Preferably said heat exchanger has a plurality of inlet galleries and outlet galleries for delivering and removing said coolant fluid to and from said first coolant chambers, and said inlet galleries and said outlet galleries are spaced apart from said first heat sink tiles.

Preferably each first heat sink tile has at least one of said plurality of first coolant chambers respectively associated therewith.

Preferably said inlet galleries are for delivering said coolant fluid from an inlet manifold such that coolant entering said respective first coolant chambers of adjacent first heat sink tiles are at substantially the same temperature to each other.

Preferably said inlet galleries are for delivering said coolant fluid from an inlet manifold in parallel at substantially the same temperature to said respective first coolant chambers of adjacent first heat sink tiles.

Preferably each first heat sink tile is substantially square and has four of said first coolant chambers associated therewith.

Preferably an expansion gap is disposed between two adjacent said first heat sink tiles.

Preferably said plurality of first heat sink tiles are provided in a grid array with expansion gaps there between.

Preferably said grid array of said plurality of first heat sink tiles is formed from a single thin sheet of metal, with each of said first heat sink tiles connected to each other by a minimal connection.

Preferably said minimal connection is a perforation or tab.

Preferably said first heat sink tiles are bonded to said photovoltaic cells of said solar panel.

Preferably an electronic control unit is electrically connected to said solar panel.

Preferably a pump disposed in said circulation system operably circulates coolant through said first heat exchanger.

Preferably a surface temperature sensor is disposed on said solar panel and operably connected to said electronic control unit, so that said pump is operated above a predetermined temperature sensed by said sensor.

Preferably said coolant fluid exiting said first heat exchanger is circulated through a second heat exchanger disposed within a storage tank containing water.

Preferably heat energy within said coolant is transferred to said water contained within said storage tank.

Preferably at least one thermoelectric module is disposed between said first heat exchanger and at least one of said respective first heat sink tiles, so that said opposite second side of said respective first heat sink tile is in direct contact with said thermoelectric module, and at least one first coolant chamber of said first heat exchanger is adjacent said thermoelectric module so that heat transfer can occur between said coolant fluid passing through said first coolant chamber and said thermoelectric module.

Preferably a heat differential between a first side of said thermoelectric module and an opposed second side thereof generates at least a portion of said electrical charge.

Preferably said plurality of first heat sink tiles and said first heat exchanger are formed in a modular unit attachable to said solar panel.

Preferably said apparatus is operably connected to a hot water system comprising at least one tank having at least one heating element for heating water, and said electricity is supplied to said heating element. Preferably said energy in said coolant is used to provide thermal assistance to heating said water in said water tank. Preferably said hot water system is also connected to a main grid power supply.

According to a second aspect the present invention consists in an apparatus for generating electricity comprising:

at least one solar panel having a plurality of photovoltaic cells and a MPPT device alone or in combination with a DC/AC inverter connected directly thereto; and a first heat exchanger;

wherein said apparatus further comprising a plurality of first heat sink tiles disposed between said solar panel and said first heat exchanger, and said first heat exchanger is connected to a circulation system which is adapted to allow a coolant fluid to flow through said first heat exchanger, and each of said first heat sink tiles having a first side in direct thermal contact with a respective one of said photovoltaic cells and an opposite second side in contact with said first heat exchanger, and said first heat exchanger having a plurality of first coolant chambers and a plurality of inlet galleries and outlet galleries delivering and removing coolant fluid to and from said first coolant chambers, each coolant chamber having an open end disposed adjacent to one of said first heat sink tiles and an opposed closed end, and said inlet galleries and said outlet galleries are spaced apart from said heat sink tiles, and said first heat exchanger has at least one second coolant chamber disposed adjacent to said MPPT device and/or DC/AC inverter.

Preferably a second heat sink is disposed between said second coolant chamber and said MPPT device and/or DC/AC inverter.

Preferably said MPPT device and/or DC/AC inverter are disposed in a housing in said first heat exchanger.

Preferably at least a portion of said heat exchanger is made of plastic and said housing is integrally formed therein.

Preferably each first heat sink tile has at least one of said plurality of first coolant chambers respectively associated therewith.

Preferably the inlet and outlet galleries are disposed at or near the closed end of said first coolant chambers.

Preferably said apparatus is operably connected to a hot water system comprising at least one tank having at least one heating element for heating water, and said electricity is supplied to said heating element. Preferably said energy in said coolant is used to provide thermal assistance to heating said water in said water tank. Preferably said hot water system is also connected to a main grid power supply.

According to a third aspect the present invention consists in an apparatus for generating electricity comprising:

at least one solar panel having a plurality of photovoltaic cells and a MPPT device alone or in combination with a DC/AC inverter connected directly thereto; and a first heat exchanger;

wherein said apparatus further comprising a plurality of first heat sink tiles disposed between said solar panel and said first heat exchanger, and said first heat exchanger is connected to a circulation system which is adapted to allow coolant fluid to flow through said first heat exchanger, and each of said first heat sink tiles having a first side in direct thermal contact with a respective one of said photovoltaic cells and an opposite second side in contact with said first heat exchanger, and said first heat exchanger having a plurality of first coolant chambers and a plurality of inlet galleries and outlet galleries for delivering and removing coolant fluid to and from said first coolant chambers, each coolant chamber having an open end disposed adjacent to one of said first heat sink tiles and an opposed closed end, and said inlet galleries and said outlet galleries are spaced apart from said heat sink tiles, and said first heat exchanger has at least one second coolant chamber disposed adjacent said MPPT device and/or DC/AC inverter.

Preferably a second heat sink is disposed between said second coolant chamber and said MPPT device and/or DC/AC inverter.

Preferably said MPPT device and/or DC/AC inverter are disposed in a housing in said first heat exchanger.

Preferably at least a portion of said heat exchanger is made of plastic and said housing is integrally formed therein.

Preferably said apparatus is operably connected to a hot water system comprising at least one tank having at least one heating element for heating water, and said electricity is supplied to said heating element. Preferably said energy in said coolant is used to provide thermal assistance to heating said water in said water tank. Preferably said hot water system is also connected to a main grid power supply.

According to a fourth aspect the present invention consists in an apparatus for cooling a solar panel having a plurality of photovoltaic cells and a MPPT device alone or in combination with a DC/AC inverter connected directly thereto, said apparatus comprising a plurality of first heat sink tiles and a first heat exchanger; said first heat sink tiles arranged in a grid array with each first heat sink tile having a first side adapted to contact a respective photovoltaic cell, each first heat sink tile disposed within the peripheral boundary of its respective photovoltaic cell, and said first heat exchanger having a plurality of first coolant chambers and a plurality of inlet galleries and outlet galleries which are adapted for delivering and removing a coolant fluid to and from said first coolant chambers, each first heat sink tile has at least one of said plurality of first coolant chambers respectively associated therewith, each coolant chamber having an open end disposed adjacent its respective heat sink tile and an opposed closed end, and said inlet galleries and said outlet galleries are spaced apart from said heat sink tiles, and said first heat exchanger has at least one second coolant chamber disposed adjacent to said MPPT device alone or in combination with a DC/AC inverter.

Preferably a second heat sink is disposed between said second coolant chamber and said MPPT device and/or DC/AC inverter.

Preferably said MPPT device and/or DC/AC inverter are disposed in a housing in said first heat exchanger.

Preferably at least a portion of said heat exchanger is made of plastic and said housing is integrally formed therein.

Preferably at least one expansion gap is disposed between two adjacent said heat sink tiles.

Preferably said heat sink tiles are formed from a single thin sheet of metal and are minimally connected to each other.

Preferably said inlet galleries are for delivering said coolant fluid from an inlet manifold in parallel at substantially the same temperature to said respective first coolant chambers of adjacent heat sink tiles.

Preferably said apparatus is operably connected to a hot water system comprising at least one tank having at least one heating element for heating water, and said electricity is supplied to said heating element. Preferably said energy in said coolant is used to provide thermal assistance to heating said water in said water tank. Preferably said hot water system is also connected to a main grid power supply.

According to a fifth aspect the present invention consists in a modular unit for attachment to a solar panel having a plurality of photovoltaic cells, said modular unit comprising:

a heat exchanger having an inlet manifold and an outlet manifold; and a MPPT device alone or in combination with a DC/AC inverter to be directly connected directly to said panel and a plurality of first heat sink tiles arranged in a grid array with expansion gaps there between; wherein each of said first heat sink tiles having a coolant side in contact with said first heat exchanger and an opposed bonding side for direct thermal contact with a respective one of said photovoltaic cells, and said first heat exchanger having a plurality of first coolant chambers disposed adjacent to said first heat sink tiles, and each first heat sink tile has at least one of said plurality of first coolant chambers respectively associated therewith, and said first heat exchanger has at least one second coolant chamber disposed adjacent to said MPPT device alone or in combination with a DC/AC inverter.

Preferably a second heat sink is disposed between said second coolant chamber and said MPPT device and/or DC/AC inverter.

Preferably said MPPT device and/or DC/AC inverter are disposed in a housing in said first heat exchanger.

Preferably at least a portion of said heat exchanger is made of plastic and said housing is integrally formed therein.

Preferably said heat exchanger has a plurality of inlet galleries and outlet galleries in fluid communication between said first coolant chambers and said inlet manifold and outlet manifold, and said inlet galleries and said outlet galleries are spaced apart from said first heat sink tiles.

A modular unit, wherein said grid array of said plurality of first heat sink tiles is formed from a single thin sheet of metal, with each of said heat sink tiles connected to each other by a minimal connection.

Preferably said minimal connection is a perforation or tab.

Preferably said inlet galleries are adapted to deliver a coolant fluid to said coolant chambers from an inlet manifold in parallel at substantially the same temperature.

Preferably said modular unit is connected to a circulation system, and a pump disposed in said circulation system is operably adapted to circulate said coolant fluid through said first heat exchanger.

Preferably said modular unit is operably connected to a hot water system comprising at least one tank having at least one heating element for heating water, and said electricity is supplied to said heating element. Preferably said energy in said coolant is used to provide thermal assistance to heating said water in said water tank. Preferably said hot water system is also connected to a main grid power supply.

According to a sixth aspect the present invention consists in a heat exchanger assembly for cooling a solar panel having a plurality of photovoltaic cells and a MPPT device alone or in combination with an inverter/grid connect directly connected thereto, said assembly comprising a plurality of first cooling groups, each first cooling group adapted for substantially independent transfer of heat from a respective photovoltaic cell; each first cooling group comprising a first heat sink tile, at least one first coolant chamber having an open end and an opposed closed end, and at least one inlet gallery and outlet gallery in fluid communication with said first coolant chamber, said first heat sink tile having a first side adapted to thermally contact said respective photovoltaic cell, and an opposite second side facing and abutted against said open end of said first coolant chamber, and said inlet gallery and said outlet gallery are spaced apart from said first heat sink tile, and said first heat exchanger has at least one second coolant chamber disposed adjacent to said MPPT device and/or inverter/grid connect.

Preferably a second heat sink is disposed between said second coolant chamber and said MPPT device and/or inverter.

Preferably said inverter is a DC/AC inverter.

Preferably said MPPT device and/or inverter are disposed in a housing in said heat exchanger assembly.

Preferably at least a portion of said heat exchanger assembly is made of plastic and said housing is integrally formed therein.

Preferably each of said first heat sink tiles is arranged in a grid array with expansion gaps there between.

Preferably said grid array of said first heat sink tiles is formed from a single thin sheet of metal, with each of said heat sink tiles connected to each other by a minimal connection.

Preferably said minimal connection is a perforation or tab connection.

Preferably each of said of first cooling groups are adapted to deliver a coolant fluid from an inlet manifold via their respective inlet galleries in parallel at substantially the same temperature.

Preferably each of said first cooling groups have outlet galleries for delivering said coolant fluid to an outlet manifold in parallel.

Preferably said heat exchanger assembly is operably connected to a hot water system comprising at least one tank having at least one heating element for heating water, and said electricity is supplied to said heating element. Preferably said energy in said coolant is used to provide thermal assistance to heating said water in said water tank. Preferably said hot water system is also connected to a main grid power supply.

BRIEF DESCRIPTION OF DRAWINGS

FIG. 5a is an enlarged cross sectional detail of the first heat exchanger assembly and its coolant chambers in accordance with the embodiment of FIG. 1.

FIG. 5b is an enlarged cross sectional detail of a first heat exchanger assembly and its coolant chambers in accordance with an alternative second embodiment utilising thermoelectric modules.

FIG. 13b depicts a cross section of the segment of the coolant gallery unit through A-A in FIG. 13a.

FIG. 13c depicts a cross section of the segment of the coolant gallery unit through B-B in FIG. 13a.

DESCRIPTION OF PREFERRED EMBODIMENTS

Firstly, FIGS. 1 to 13c is a description of the preferred embodiments also disclosed in international Patent Publication No. WO/2015/188226 (Application No. PCT/AU2015/050309). These embodiments are directed to a system for generating electricity comprising a solar panel and an array of heat sink tiles with heat exchanger fixed thereto that provide an increased power output.

These embodiments can be employed with the particular arrangements of the present invention further described in FIGS. 14 to 18.

Embodiment of International Patent Publication No. WO/2015/188226

Figure 1:
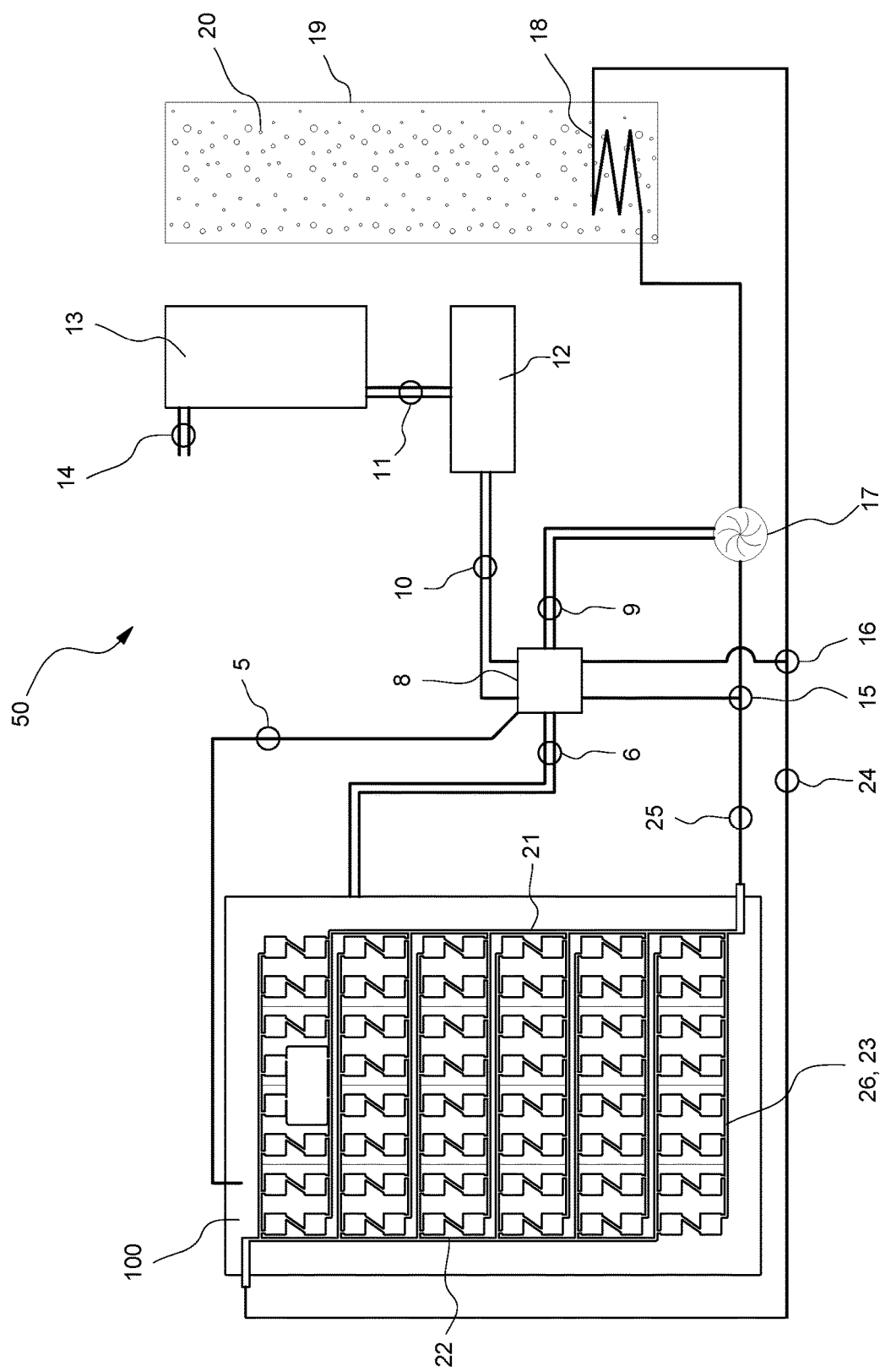
FIG. 1 shows a schematic view of a system for generating electricity in accordance with a first embodiment.
Figure 2:
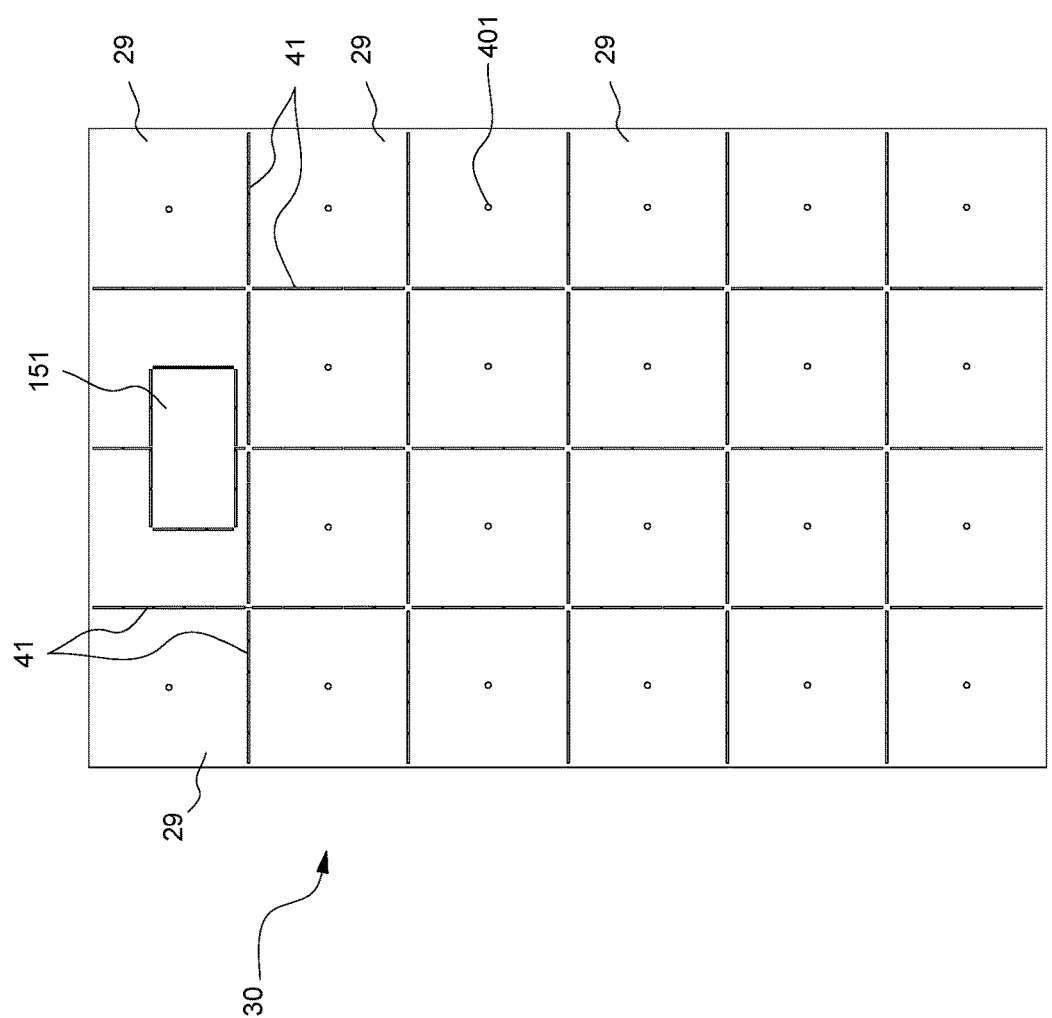
FIG. 2 is a schematic view of the array of heat sink tiles used in the system depicted in FIG. 1.

FIGS. 1 to 5a and 6 to 7c depict a system 50 for generating electricity comprising a solar panel 100 and an array 30 of heat sink tiles 29 with heat exchanger 26 fixed thereto. Heat sink tiles 29 are arranged in a "grid array" as best seen in FIG. 2 and are spaced apart such that expansion gaps 41 exist there between. A "cut out" space 151 is disposed in two of tiles 29, so that they may be fitted around electrical junction box 150 of solar panel 100.

Solar panel 100 is a conventional set of solar photovoltaic modules, represented by photovoltaic layer 200 which contains twenty four photovoltaic cells 38, a backing layer 39 adhered thereto and a glass protection layer 40. In this embodiment, the photovoltaic cells 38 are of a common size used, namely 156 mm×156 mm. Backing layer 39 is typically a thin plastic sheet or paint, whose purpose is to protect photovoltaic cells 38 from UV, moisture and weather. However, layer 39 is intentionally thin so as to not provide any substantive thermal insulation to cells 38.

Each heat sink tile 29, preferably made of thin sheet aluminium (of about 1 mm thickness) is fixed to and therefore associated to a respective photovoltaic cell 38 via thin layer 39, of the photovoltaic layer 200.

Figure 4:
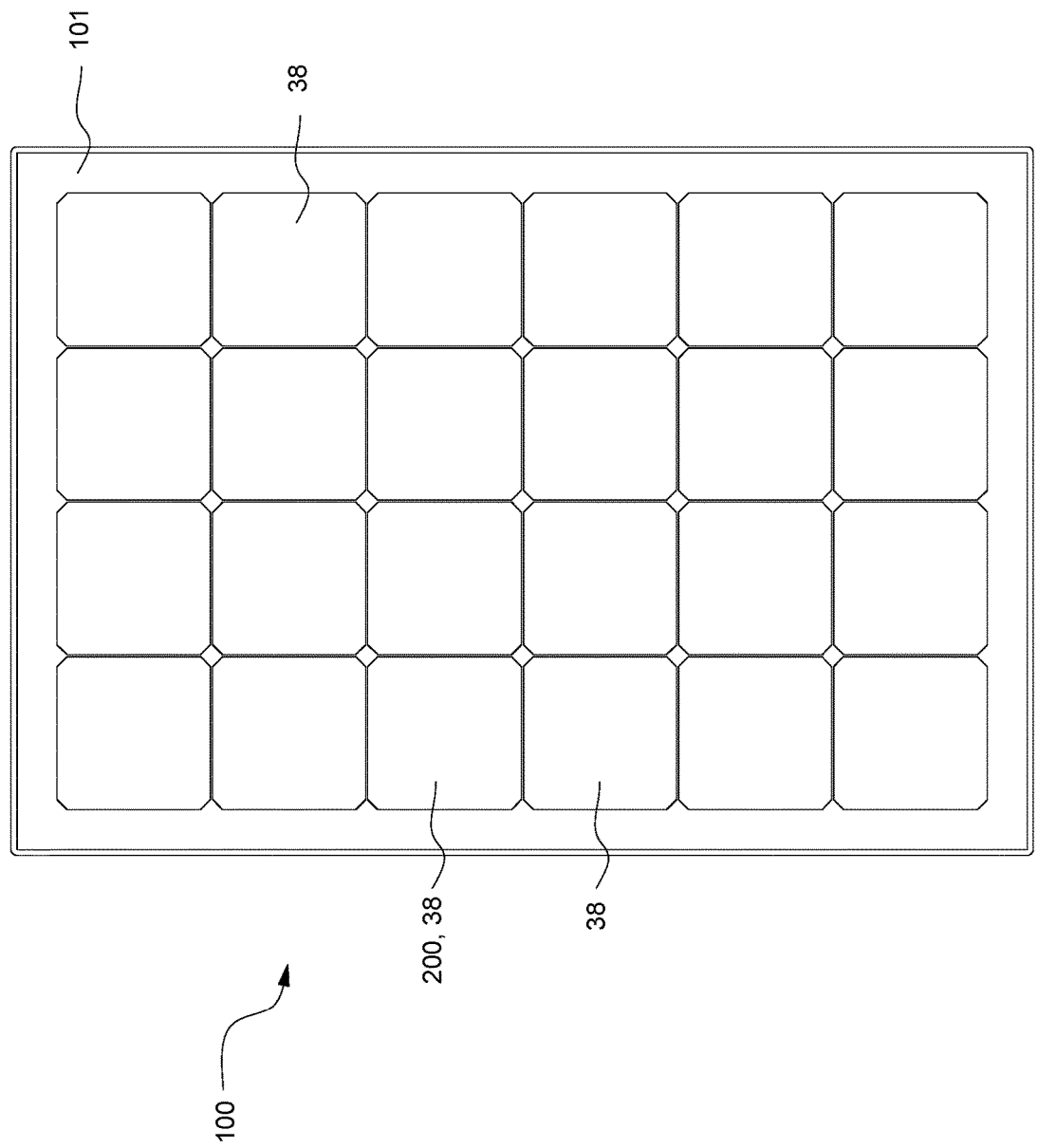
FIG. 4 is a schematic view of a conventional prior art solar panel used in a system for generating electricity in accordance with the embodiment of FIG. 1.
Figure 6:
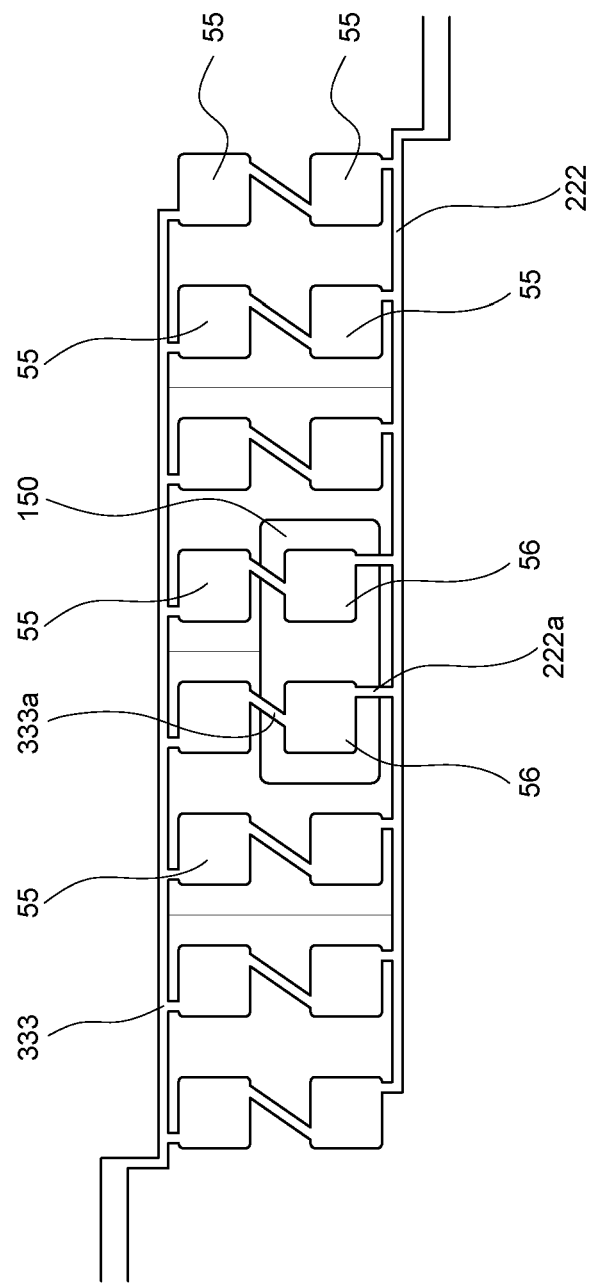
FIG. 6 is an enlarged schematic view of cooling arrangement at the solar panel junction box region of the embodiment shown in FIG. 1.

Solar panel 100 is electrically connected and mounted on a supporting structure, and operably connected to an electronic control unit (ECU) 8 via leads 6. Solar panel 100 has a panel frame 101, as shown in FIG. 4. A battery (or bank of batteries) 12 is also operably connected to ECU 8 via leads 10.

System 50 also comprises a circulation system including a first heat exchanger (water gallery exchanger) 26, circulation pipe network 24, 25, circulation pump 17 and second heat exchanger 18 disposed within water storage tank 19. Water, or some other coolant, is able to be pumped through circulation pipe network 24, 25 between first heat exchanger 26 and second heat exchanger 18.

Figure 3:
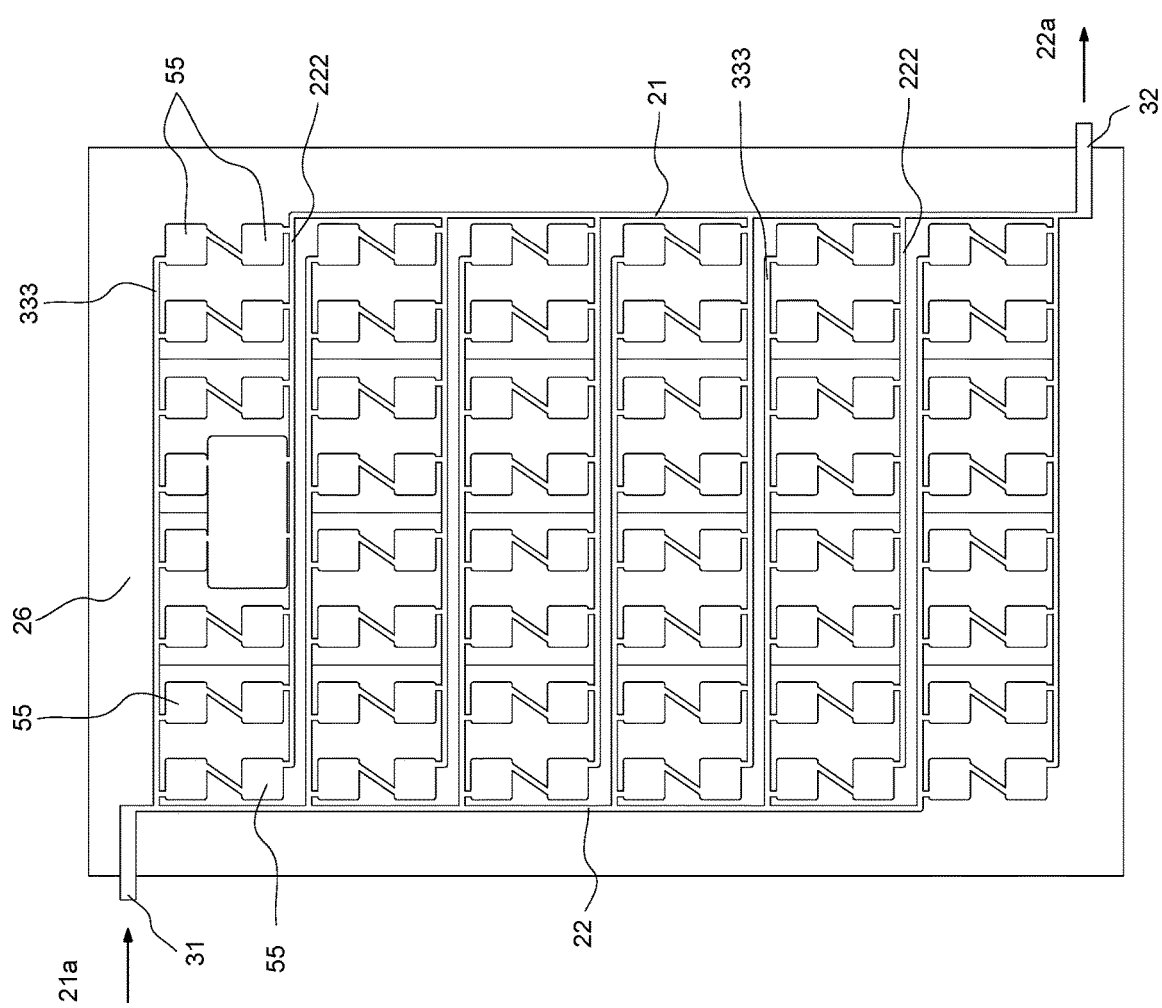
FIG. 3 is a schematic view of the first heat exchanger and its coolant chambers connected thereto of the embodiment shown in FIG. 1.

First heat exchanger 26 has an inlet manifold 21 and outlet manifold 22, and a plurality of galleries 23 extending there between. In FIG. 3, water is shown entering inlet manifold 21 via inlet 31 as arrow 21a, and exiting outlet manifold 22 via outlet 32 as arrow 22a.

In addition to inlet manifold 21 and outlet manifold 22, heat exchanger 26 has a plurality of galleries, namely cold water gallery 222 and warm water gallery 333, connected to coolant chambers 55 extending there between. Each coolant chamber 55 has an "open end" disposed adjacent a tile 29 and an opposed closed end. Each gallery 222,333 of heat exchanger 26 comprises a "tubular member", best seen in FIG. 5a. The "tubular member" of gallery 222, 333 is the conduit through which coolant fluid passes there through when heat exchanger 26 is in use. Galleries 222,333 fluidally connect to chambers 55 at or near the "closed end" thereof. By disposing the galleries 222,333 at a location away, or spaced apart from heat sink tiles 29, there is minimal transfer of heat between tiles 29 and coolant in galleries 222,333. This minimal transfer of heat between tiles 29 and coolant in galleries 222,333 can be improved by choosing a suitable grade and thickness of plastic from which heat exchanger 26 is made that provides certain level of thermal insulation.

As best seen in FIG. 5a each coolant chamber 55 is fixed at the rear of the photovoltaic layer 200 of solar panel 100 via the heat sink tiles assembly 29. In this embodiment a conventional commercially photovoltaic solar panel 100 is used, and heat sink tiles 29 made of aluminium, are disposed between coolant chambers 55 and cells 38 of photovoltaic layer 200, and in "direct thermal contact" therewith.

In this specification "direct thermal contact" between a heat sink tile 29 and a respective photovoltaic cell 38, means that tile 29 is bonded to photovoltaic cell 38 or its thin adjacent layer 39, via an adhesive 58, which may for example be an epoxy resin or thermal plaster. The layer 39 and adhesive 58 are so thin that they do not prevent substantive heat transfer between tile 29 and its respective photovoltaic cell 38.

In this embodiment four coolant chambers 55, their associated galleries 222,333 and the respective heat sink tile 29 is referred to as a "cooling group". However, it should be understood that the invention in other embodiments may utilise a different number of coolant chambers in each "cooling group" with its respective heat sink tile 29.

In this embodiment solar panel 100 is rated at 100 watts. Each heat sink tile 29 with its "cooling group" of four coolant chambers 55 of heat exchanger 26, has its "bonding side" correspondingly fixed and aligned with a respective photovoltaic cell 38 via adjacent layer 39 on the rear layer 200 of panel 100. The other side of each heat sink tile 29, i.e. its "cooling side" is in communication with the coolant chambers 55, i.e. it is in contact with heat exchanger 26.

The cold water gallery 222 ensures that water (coolant) of substantially the same temperature from inlet manifold 21 is entering each "cooling group" of coolant chambers 55 associated with each heat sink tile 29, and the water (coolant) with elevated temperature that exits chambers 55 via outlet galleries 333 are delivered to outlet manifold 22. This ensures substantially "linear removal heat".

It should be noted that coolant chambers 55 are cavities that are substantially larger in size than the galleries 222,333 extending from them. For instance in this embodiment, coolant chambers 55 are about 40 mm×40 mm×5 mm, whereas galleries 222,333 have a internal diameter of about 4 mm. Chambers 55 which are open to heat sink tiles 29, ensures that water passing through chambers 55 is in direct contact with tiles 29 and an efficient heat transfer occurs there between.

Figure 8:
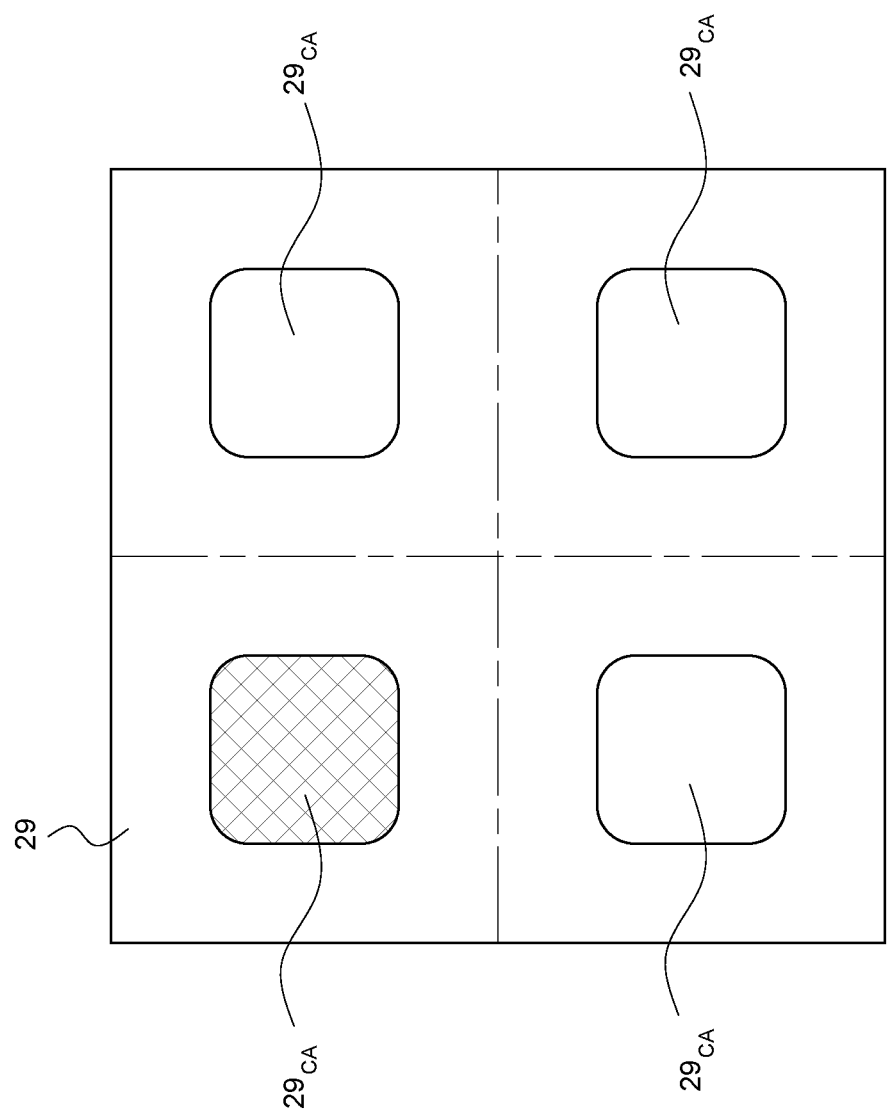
FIG. 8 depicts an enlarged schematic view of a single heat sink tile from the array of tiles shown in FIG. 2, with the location of the coolant fluid contact areas.
Figure 9:
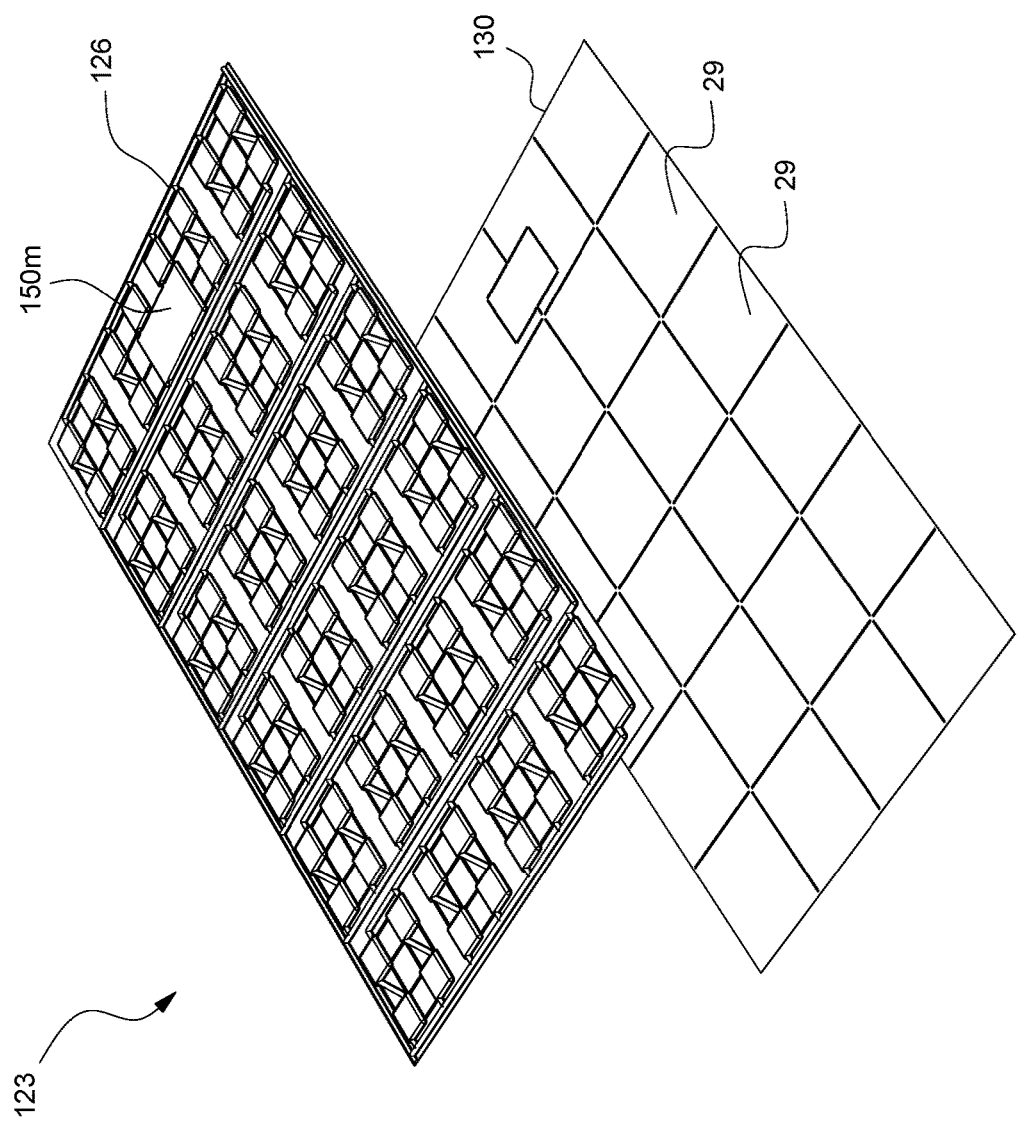
FIG. 9 is an exploded perspective view of an alternative embodiment of a heat exchanger (coolant gallery unit) and array of heat sink tile forming a modular unit that can be attached to a solar panel and used in the system of FIG. 1.
Figure 10:
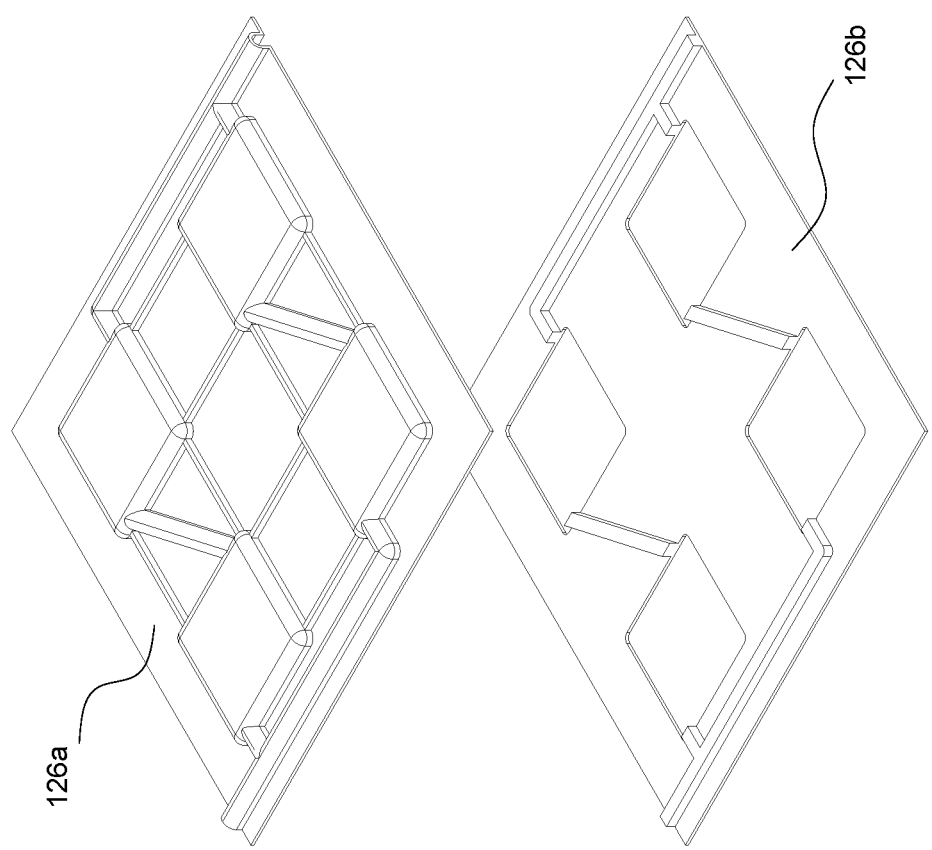
FIG. 10 depicts an exploded segment of first and second production parts that can be assembled to form a coolant gallery unit forming part of the modular unit depicted in FIG. 9.
Figure 11:
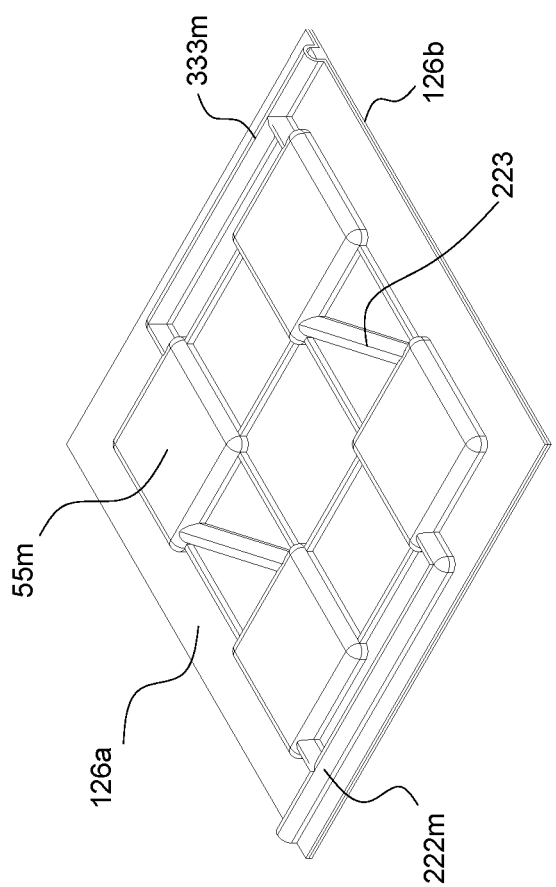
FIG. 11 depicts a top perspective view of the two assembled production parts of FIG. 10.
Figure 12:
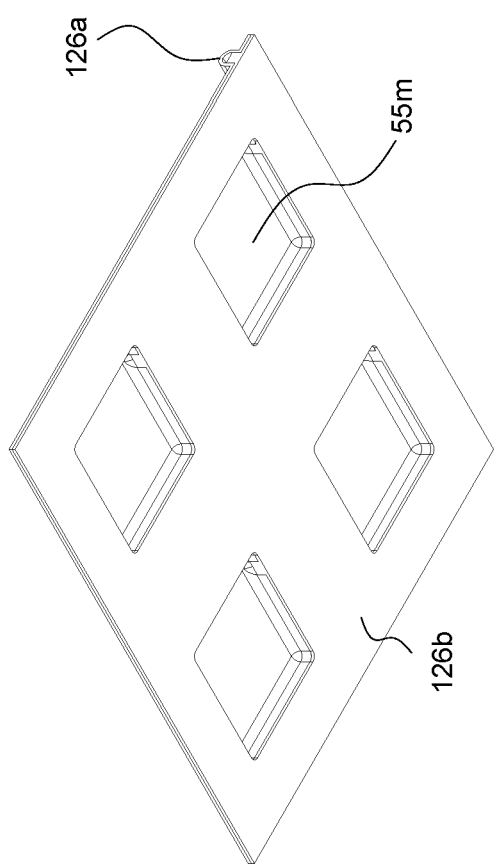
FIG. 12 depicts a bottom perspective view of the two assembled production parts of FIG. 10.
Figure 13A:
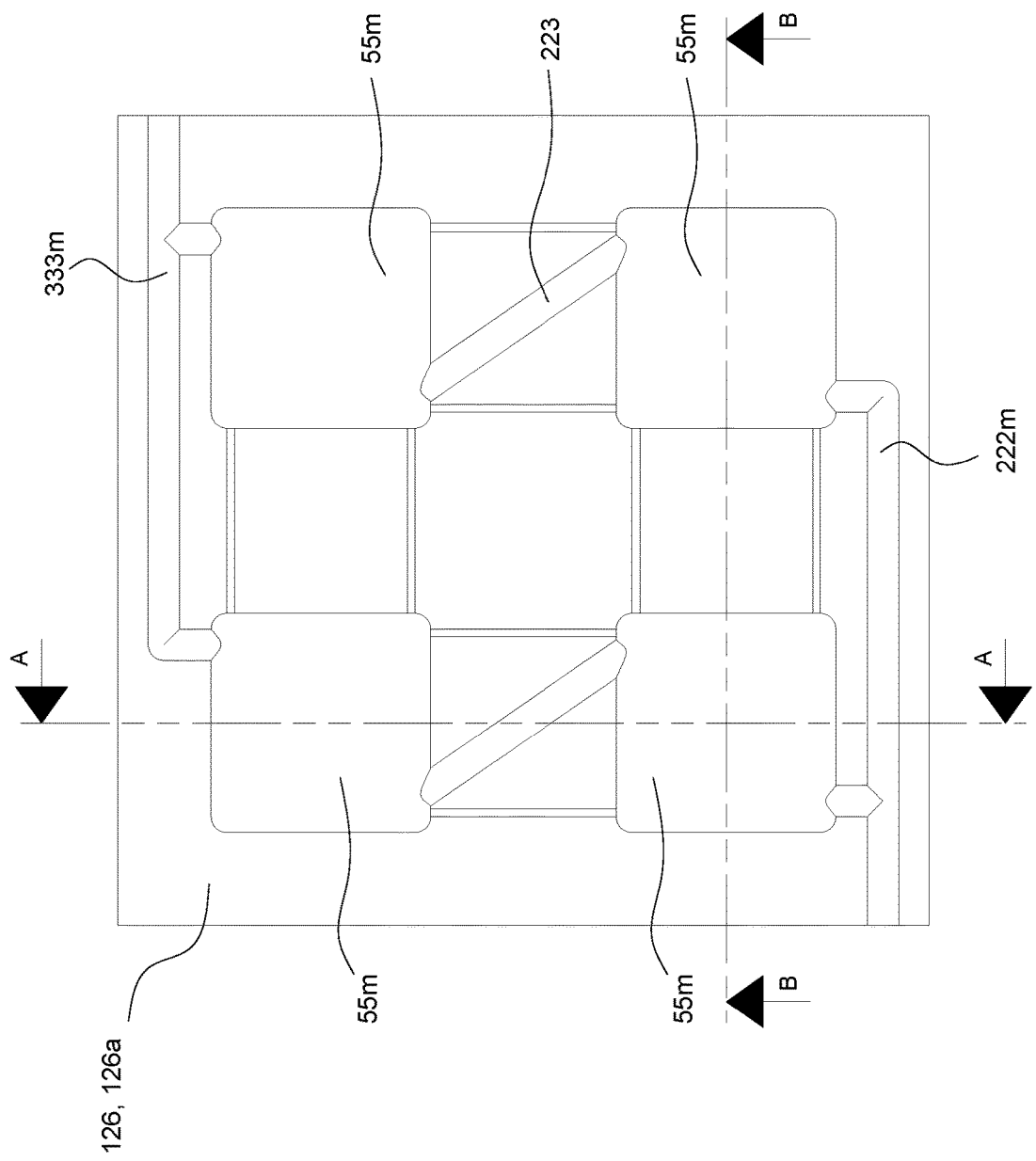
FIG. 13a depicts an enlarged plan view of the segment of the coolant gallery unit shown in FIG. 10.

FIG. 8 schematically depicts a square heat sink tile 29, typically about 155 mm×155 mm. In use it would be laid over a respective photovoltaic cell 38 that makes up layer 200. Four areas $29_{CA}$ are shown, one of which is shaded, each of which is disposed centrally in a respective quadrant of heat sink tile 29. Each of these areas $29_{CA}$ is about 40 mm×40 mm, namely about 1600 mm² Each area 29ca represents both the "open end" of the coolant chamber 55 and the "contact area" on heat sink tile 29 being directly contacted by the coolant fluid passing through the respective coolant chamber 55. Each area $29_{CA}$ comprises at least one quarter of the surface area of the quadrant of the heat sink tile 29 it is disposed on. Contact areas of this size are effective in ensuring the cooling effect extends to all areas of the "tile quadrant", where the internal cavity height of each cooling chamber 55 is about 5 mm.

By ensuring that heat sink tiles 29 are slightly smaller than the respective photovoltaic cells 38 they are associated with and thermally contacted to, a "gap" can be provided between each heat sink tile 29 in the "grid array". As heat sink tiles 29 have gaps between them, then heat transfer from one heat sink tile 29 to another is minimised, and expansion and contraction of each tile 29 is possible, substantially independent of the surrounding tiles 29. Preferably, a continuous gap at the periphery boundary of tiles 29 would be desirable, however, if heat sink tiles 29 are "minimally connected" to each other by perforations or tabs 49, heat transfer between heat sink tiles 29 is still minimized, and tiles 29 are still able to individually expand and contract. In this specification "minimally connected" means that length of gaps 41 between adjacent tiles 29 are substantially larger than the length of any tabs 49 or other connection that would interconnect them.

Figure 7A:
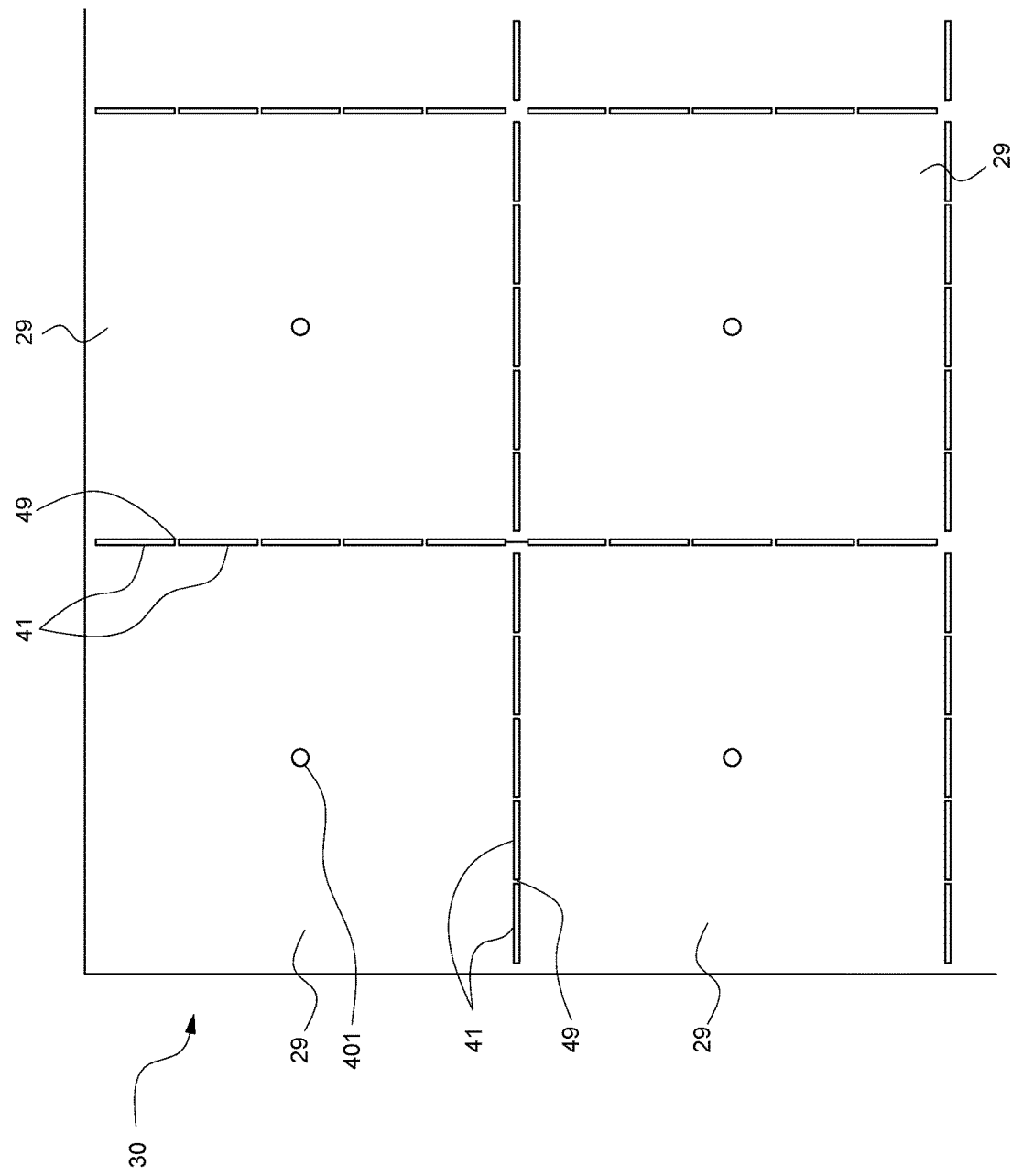
FIG. 7a depicts an enlarged schematic view of some of the heat sink tiles shown in FIG. 2.
Figure 7B:
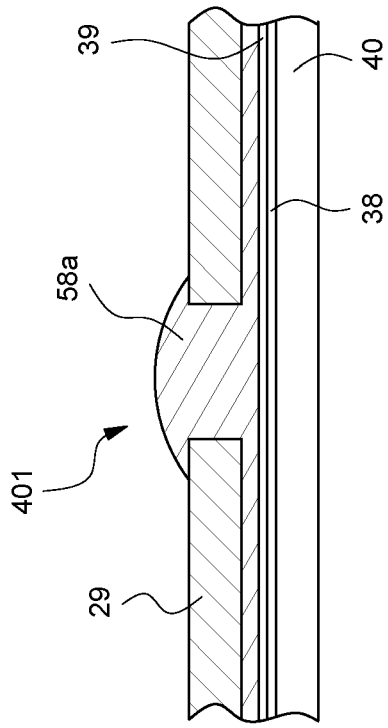
FIG. 7b depicts an enlarged schematic view of the adhesive detail of the centre of a heat sink tile shown in FIG. 7a, attached to the photovoltaic layer of the embodiment shown in FIG. 1
Figure 7C:
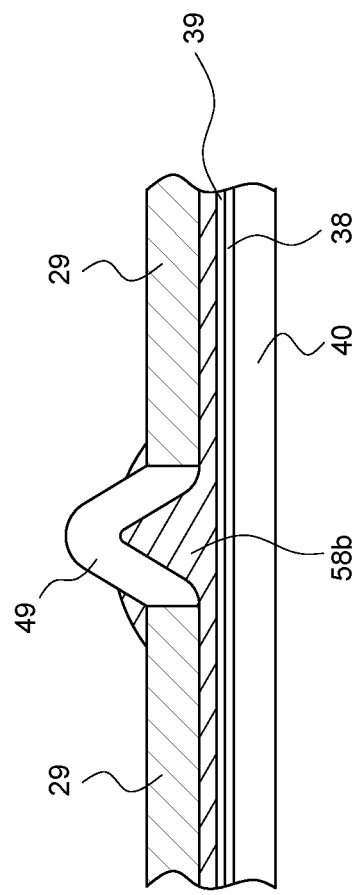
FIG. 7c depicts an enlarged schematic view of the adhesive detail of two adjacent heat sink tiles shown in FIG. 7a attached to the photovoltaic layer of the embodiment shown in FIG. 1.

As seen in FIG. 7a the "grid array" 30 of heat tiles 29 is for ease of manufacture made from as single sheet of aluminium. Each heat sink tile 29 has a very small opening 401 at its centre. At the time of bonding heat sink tile 29 over a respective photovoltaic cell 38 via layer 39 using adhesive 58, opening 401 allows for excess adhesive 58a to pass there through, as shown in FIG. 7b. In the single sheet "grid array" 30, tabs 49 are used to minimally connect heat sink tiles 29 at the periphery boundary between heat sink tiles. At gap 41 adjacent to tab 49, excess adhesive 58b may pass there through, as shown in FIG. 7c. Tab 49 is shown as bent or creased, but it should be understood that tab 49 could be shaped otherwise.

Adhesive 304 is used to bond heat exchanger (water gallery exchanger) 26 via coolant chambers 55, to tile assembly 29. Heat sink tiles 29 should preferably be a maximum size of about 155 mm×155 mm, to avoid damage or failure to their respective slightly larger photovoltaic cells 38 they are associated with. This is because the different materials of the photovoltaic cells 38 and tiles 29 expand and contract at different rates. Gaps 41 between tiles 29 are needed but may be filled with adhesive to allow for expansion and shrinkage. In this embodiment, as a tile 29 is slightly smaller than the respective photovoltaic cell 38 it is bonded to, the periphery of each tile 29 lies within the circuit boundary lines of the respective twenty four photovoltaic cells 38 on the opposing front side of layer 200.

As can be seen in FIG. 5A, coolant chamber 55 is formed by chamber housing members 305 being bonded to galleries 222,333 of heat exchanger 26 and also positioned and bonded against the rear side of heat sink tile 29, via adhesive (bonding agent) 304. A cooling gallery chassis 303 interconnects the gallery structure. In use coolant flowing through heat exchanger 26 enters a coolant chamber 55 via cold water gallery 222 and exits via warm water gallery 333. Heat transfer occurs between heat sink tile 29 and the coolant passing through coolant chamber 55.

Surface temperature sensor 5 disposed on solar panel 200, senses change in temperature of the "photovoltaic operational surface" of panel layer 200. Sensor 5 is operably connected to ECU 8. Pump 17 is operably connected to ECU 8 via power cable 9 such that its operation can be controlled thereby.

In use when a predetermined temperature has been reached, say about 28° C., ECU 8 switches water circulating pump 17 to "on", causing coolant to flow through pipe 24 into first heat exchanger 26 across the rear of panel layer 200 and circulating through galleries 222,333, coolant chambers 55 and pipe 25 and heat exchanger 18 in water tank 19. The "coolant" in heat exchanger 26 causes a heat differential to occur throughout the array of heat sink tiles 29 and drawing the heat across from the heat on the front "panel" facing side and cold on rear "exchanger" side.

In addition, remotely positioned secondary coolant chambers 56 in the electrical connection box 150 are fluidly connected via 222A and 333A. Secondary coolant chambers 56 reduce the localised heat within the box 150 which houses electrical connections of said solar panel.

The resulting heat is removed from the rear of solar panel via first heat exchanger 26 and pipe network 24, 25, and circulated by pump 17, such that it is pumped through second heat exchanger unit 18, whereby the "heat energy" of the circulating coolant is transferred into stored water 20, in tank 19, thereby elevating its temperature for future use.

Coolant is delivered throughout first heat exchanger 26 through inlet manifold 21 and is further delivered individually to each "cooling group" of coolant chambers 55 via cold water gallery 222 and exits coolant chambers 55 via warm water galleries 333 and outlet manifold 22. A substantially even linear removal of heat is obtained throughout the photovoltaic layer 200 and first heat exchanger 26. This is because each "cooling group" with its heat sink tile 29 is in most part "independently" cooling its respective photovoltaic cell 38. This substantially independent cooling in combination with minimal heat transfer between adjacent heat sink tiles 29, and therefore adjacent "cooling groups" ensures that heat from a "hotspot" in one photovoltaic cell 38 is not spread to other photovoltaic cells 38 in layer 200. This contributes significantly to improved efficiency of the output power of panel 100. Furthermore, the substantially independent expansion and contraction of each of heat sink tiles 29 means that less stress is placed on the photovoltaic cells 38 they are associated with, therefore minimising the likelihood of cracking and fatigue of photovoltaic cells 38.

It must also be understood the system 50 is specifically designed to eliminate hotspots throughout solar panel 200, resulting in a greatly elevated electrical output within a solar radiation environment, and providing a photovoltaic panel with an improved electrical output.

In the abovementioned embodiment the "coolant" is preferably water, but may include conventional coolant additives such as ethylene glycol or other heat transfer agents, such as those commonly used in air conditioners or car engine cooling. The coolant but may be substituted for a commercially available gas.

In the abovementioned embodiment the gallery assembly components of the heat exchanger 26, including galleries 222,333 and chamber members 305 are preferably manufactured from plastic, but may in other embodiments be made of other suitable materials.

A heat exchange system similar to system 50 using coolant chambers 55 and heat sink tiles 29 was prototyped and trialled to ascertain the improvement in efficiency of solar panel output that direct contact of coolant on the heat sink tiles could achieve. A monocrystalline 100 W solar panel by SOLRAISER™ model no. SPM-ST100 W having an array of twenty four photovoltaic cells was first trialled outdoors during daylight without any heat exchanger arrangement. Without any cooling and at an ambient temperature of about 26° C., the photovoltaic cell temperature typically was about 73° C., and only produced about 25 W. When the heat exchange system similar to system 50 was fitted to this panel, and the panel was cooled, at an ambient temperature of about 26° C., the photovoltaic cell temperature was typically reduced to 23° C. and the panel produced in excess of 70 W.

FIGS. 9 to 13c depict a second embodiment which allows the important components of the earlier described first embodiment, namely coolant galleries 222,333 including coolant chambers 55 of heat exchanger 26 and heat sink tiles 29 to be constructed as a modular unit 123 which can be readily constructed alone and attached to a solar panel 100 to be utilised in a system similar to the first embodiment.

This modular unit 123 has its primary components provided in two integrated production parts, namely coolant gallery unit (CGU) 126 and heat sink tile array (HSTA) 130.

For ease of reference, the assembly of the first primary production part is shown in FIGS. 10 to 13c, showing just a segment of CGU 126 that would make up a single "cooling group" made up of four coolant chambers 55m, their associated galleries 222m,333m and the respective heat sink tile of array 129.

CGU 126 is preferably formed as an assembly of two plastic components, first component 126a and second component 126b which together form coolant chambers 55m and inlet and outlet galleries 222m, 333m and other interconnecting galleries 223.

Not only does CGU 126 contain coolant galleries 222m, 333m, 223 and coolant chambers 55m, it also includes the electrical junction box housing 150m for a solar panel 100 of the earlier embodiment.

The second primary production part, namely HSTA 130 is preferably a single sheet of thin gauge aluminium. It may be formed, stamped, pressed, perforated and cut-out in single operation, or possibly chemically etched. HSTA 130 comprises the array of heat sink tiles 29 which are "minimally connected" to each other by perforations or tabs.

CGU 126 and HSTA 130 are permanently bonded together to form a complete unit, namely modular unit 123. This modular unit 123 can be made and packaged separately for remote, additional fitment to solar panel 100, whether at manufacturing end product level or as an addition to panels 100 already in service.

The marked improvement in efficiency of power output of the present invention, whether employing the arrangement shown in the first or second embodiments, is because of a number of reasons. Firstly, using heat sink tiles 29 that are spaced apart from each other with "minimal connection" or no connection ensures that very little heat transfer occurs between them. This means that "hotspot" heat on one photovoltaic cell 38 is not readily transferred to an adjoining cell 38 via adjacent heat sink tiles 29. Secondly, the heat transfer from each photovoltaic cell 38 by a "cooling group" is occurring substantially independently from heat transfer of adjoining photovoltaic cells 38, with the primary heat transfer occurring between cooling chambers 55 and a respective heat sink tile 29 in any one cooling group. Thirdly, as inlet and outlet galleries 222,333 are disposed away, or spaced apart from the surface of heat sink tiles 29, very little heat transfer occurs between tiles 29 and galleries 222,333.

In the abovementioned first embodiment as shown in FIG. 5a, tile 29 is disposed between a cell 38 of solar panel 100 and coolant chambers 55. However, in an alternative embodiment as depicted in FIG. 5b, the use of a thermoelectric module 1 and heat sink pad 27 is added to the structure of the embodiment shown in FIG. 5a. In the FIG. 5b embodiment thermoelectric modules 1 have a first side thereof in direct contact with heat sink tile 29 and an opposed side is abutted (in direct contact) with heat sink pad 27. Opposed edges of thermoelectric module 1 and heat sink pad 27, sit under the stepped regions 42 of chamber members 305. In this embodiment the coolant passing through coolant chamber 55 passes over heat sink pad 27.

Where the arrangement of FIG. 5b is used in system 50 of the first embodiment, thermoelectric modules 1 are operably connected to ECU 8 via leads (not shown). The heat differential between a first side of thermoelectric modules (against heat sink tiles 29) and opposed second sides thereof generates an electrical charge, which is delivered to battery 12 via the abovementioned not shown leads. This generation of electrical charge is similar to that generated in the embodiments described in International patent publication No. WO2015/039185 (Webb et al.). However, in this embodiment shown in FIG. 5b, the coolant flowing through coolant chambers 55 provides improved cooling when compared to the prior art, thus providing a potentially increased heat differential, and therefore a greater amount of electrical charge generated by thermoelectric modules 1.

In the abovementioned embodiments, the heat exchanger assembly components and heat sink tiles could be attached to solar panels either at the manufacturing stage, or retrofitted to existing solar panels. The heat exchanger assembly components and heat sink tiles could be provided in "modular unit" form.

Particular Embodiments of Present Invention

Figure 14:
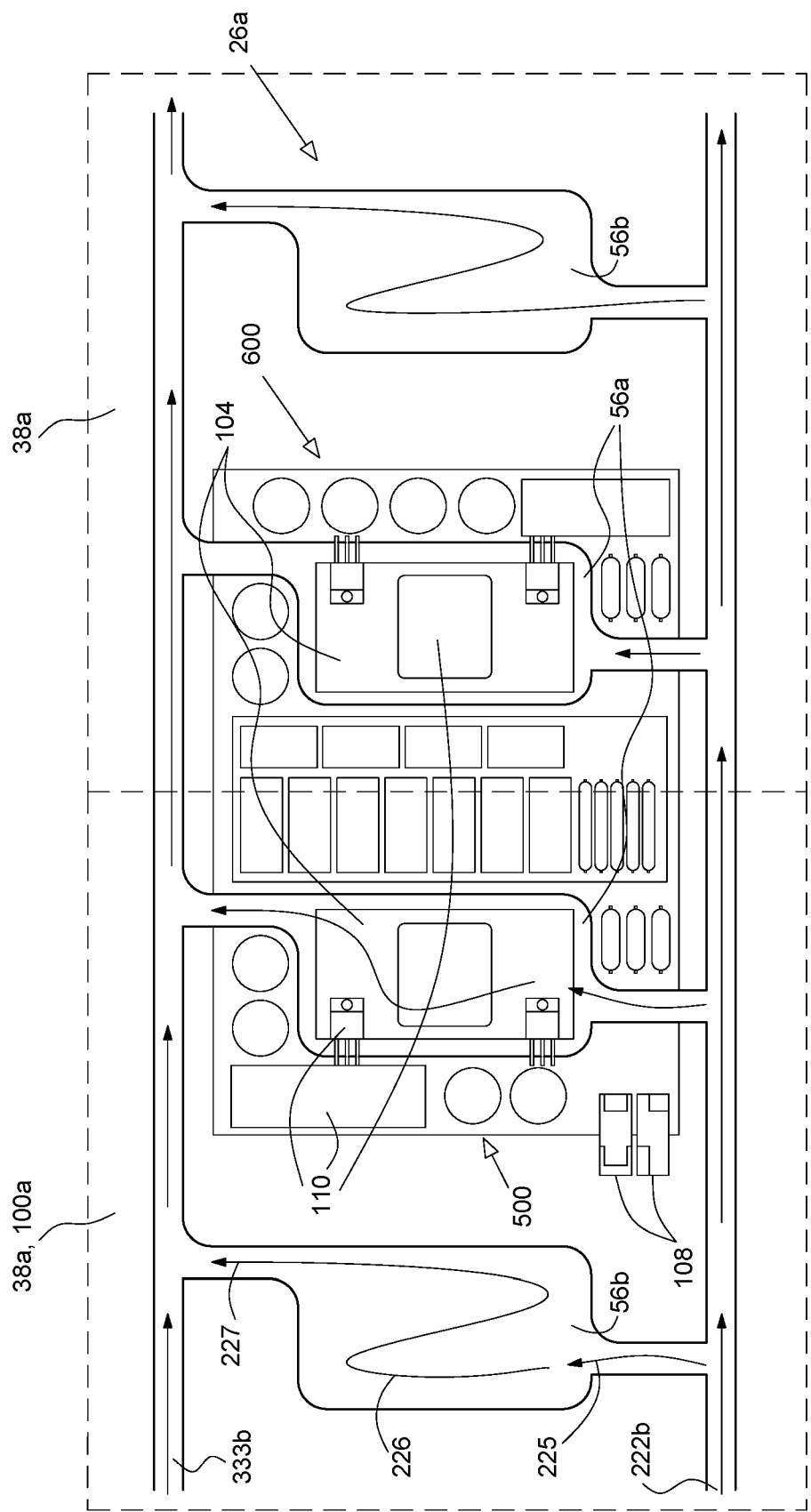
FIG. 14 depicts an embodiment of a cooling arrangement for a MPPT circuit (device) in combination with DC/AC inverter circuit.
Figure 15:
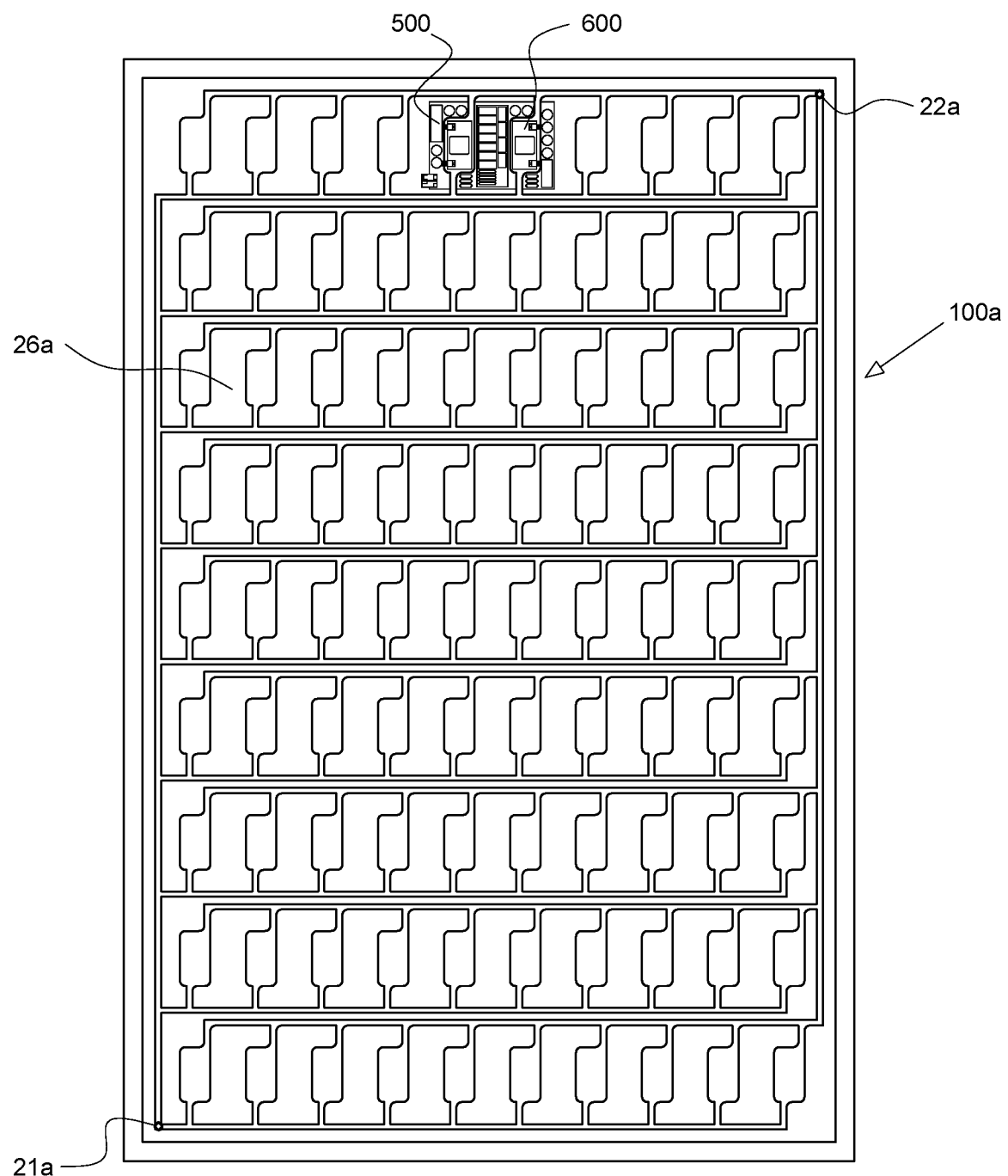
FIG. 15 depicts the cooling arrangement for a MPPT circuit (device) in combination with DC/AC inverter circuit of FIG. 14 in use with a heat exchanger being used to cool a solar panel.

FIGS. 14 and 15 depict a particular embodiment of a combination of MPPT (Maximum Power Point Tracking) and Pure Sign Wave AC Grid Connect Circuitry, which can be used with the earlier described embodiments of system 50 shown in FIGS. 1 to 13c.

As best seen in FIG. 14, MPPT device (MPPT circuitry) 600 in conjunction with a DC/AC inverter (pure sign wave grid connect circuitry) 500 are both thermally connected via electronic heat sink (aluminium heat sink) 104 to coolant chambers 56a of heat exchanger 26a, thereby providing heat (thermal) dissipation for electronic components 110 associated with photovoltaic cells 38a of solar panel 100a. Additional coolant chambers 56b are located on either side of circuitry 500,600, and together with coolant chambers 56a form a group of "cooling chambers" cooling the vicinity of the circuitry 500,600.

Preferably heat exchanger 26a has its "coolant gallery unit" made of plastic, and the "circuitry housing" in which MPPT circuitry 600 and inverter 500 is integrally formed in the coolant gallery unit, as are cooling chambers 56a. Electronic heat sink 104 is disposed between MPPT circuitry 600 and inverter 500 and cooling chamber 56a.

The array of photovoltaic cells 38a delivers DC electrical current directly in to MPPT circuitry 600, which is in physical thermal contact and direct proximity to the exiting DC connections. By this we mean MPPT circuitry 600 and DC/AC inverter 500 are connected directly to DC output of photovoltaic cells 38a.

MPPT circuitry 600 maximises the photovoltaic output of the array of photovoltaic cells 38a. MPPT circuitry 600 then delivers the maximum DC output to DC/AC inverter 500, which converts the DC current to high voltage AC current, delivered to AC output 108. This allows solar panel 100a to then be connected in series to other like panels 100a (of the same type), thus eliminating all other forms of storage, high output conversion and other high loss electric equipment including batteries.

As MPPT circuitry 600 and inverter 500 are thermally connected to coolant chambers 56a, they are cooled via a coolant that is circulated through heat exchanger 26a and passes through chambers 56a.

Heat exchanger 26a will preferably be a heat exchanger which also cools the photovoltaic cells of solar panel 100a as shown in FIG. 15. Heat exchanger 26a will have a cold water gallery 222b and outlet gallery 333b. Cold water gallery 222b by receiving water (coolant) from inlet manifold 21a, see arrow 225, ensures the cooling chambers (cooling group for circuitry) 56a, 56b associated with MPPT device 600 and inverter (grid connect) 500 is at substantially the same temperature. Water passes through these chambers 56a, 56b, see water path arrow 226, 227 and exits via outlet gallery 333B to outlet manifold 22a.

What should be understood is that the panel 100a, photovoltaic cells 38a and heat exchanger 26a of this particular embodiment is similar to the earlier described solar panel 100, photovoltaic cells 38 and heat exchanger 26 (or CGU 126) of system 50 using coolant chambers 55 and heat sink tiles 29 described in the earlier embodiments. The difference in this embodiment is that present MPPT device 600 and inverter (grid connect) device 500 are housed in "circuitry housing" integrally formed in heat exchanger 26a and the use chambers 56a, 56b to provide cooling to these circuits. Such arrangement provides high voltage AC and pure sign wave with the ability to be connected in parallel to other panels 100a fitted with the same technology. MPPT circuitry 600 and inverter 500 need only be constructed to handle the maximum capacity of photovoltaic panel 100a, such as for example 250 Watt. Furthermore as system 50 incorporates heat exchanger 26a for cooling solar panel 100a, there is surplus cooling capacity that can readily be adapted to serve as cooling for the MPPT circuitry 600 and inverter circuitry 500.

By incorporating a "grid connect" in inverter 500, then each solar panel 100a is capable of being used individually or connected in series. In this specification the term "inverter/grid connect" means an inverter that has an AC grid connect integral therewith.

By providing a series of cooled panels 100a, each of which has its own MPPT device 600 with a DC/AC inverter/grid connect 500 which are also cooled by the same coolant that cools photovoltaic cells 38, it is possible to achieve a number of advantages over conventional solar panels. These advantages are as follows:

It can eliminate the need for electrical power storage systems;
It can uses the grid as a passive storage system;
It minimizes or eliminates DC loss through cabling;
It enables lighter high voltage AC cables to be used;
It can be directly plugged in to any wall socket;
It can eliminate other electronic management systems;
Where many panels 100a are connected together the system automatically provides for redundancy (if one panel fails the whole system keeps running); and
It can minimize the effects of weak and strong panels operating together to cause deficiencies in output.

Furthermore by having a single heat exchanger 26a that cools both the photovoltaic cells 38a and the MPPT circuitry 600 and inverter (grid connect) circuitry 500 means that a single pump for circulation of coolant can be used.

In one particular application, the embodiment described in FIG. 14 of MPPT circuitry 600 combined with inverter circuitry 500 and cooled by cooling chambers 56a,56b of heat exchanger 26a, can be used with a solar thermal hot water unit.

Figure 16:
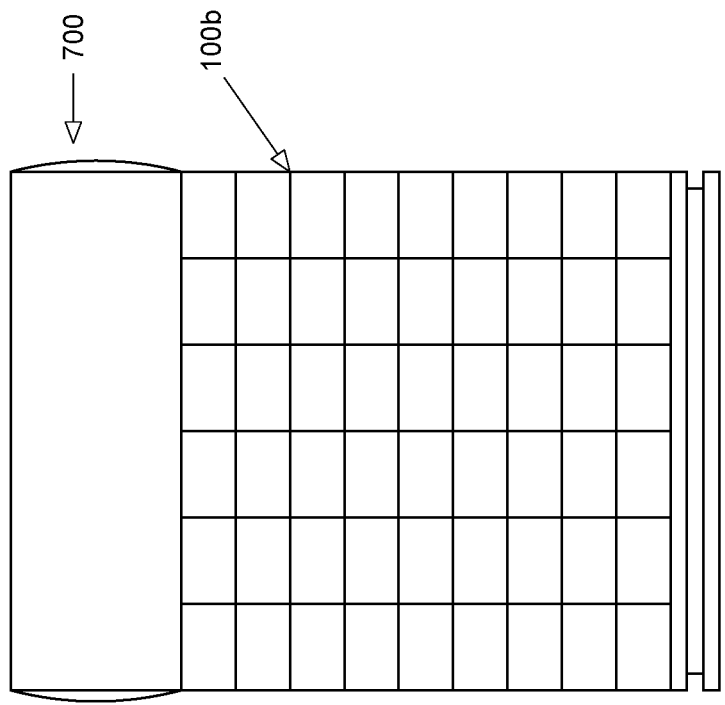
FIG. 16 is an elevation view of a solar thermal hot water unit that uses a heat exchanger to cool a solar panel, as well as a MPPT circuit (device) in combination with DC/AC inverter circuit.
Figure 17:
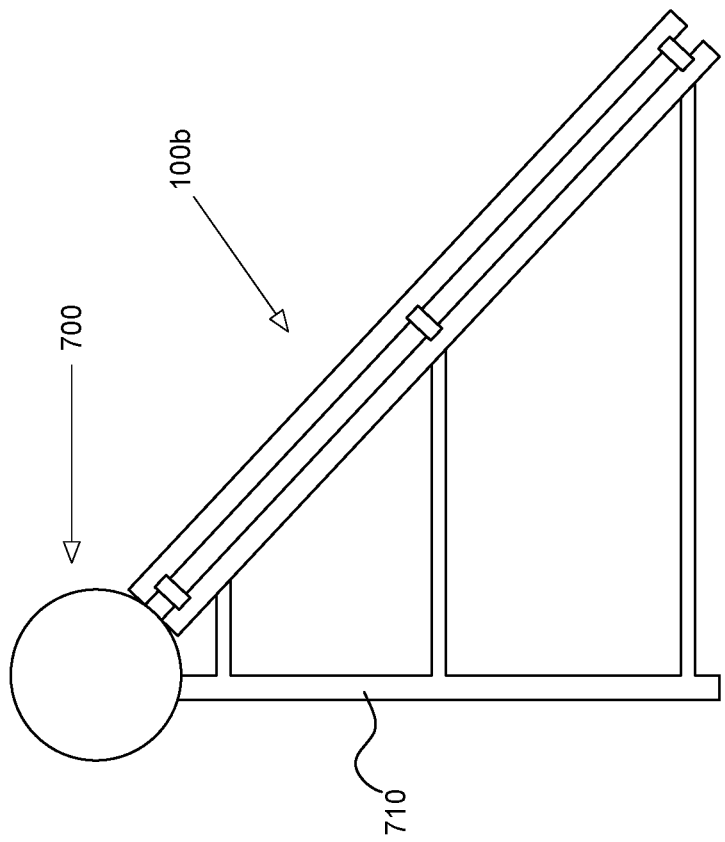
FIG. 17 is a side view of a solar thermal hot water of FIG. 16.
Figure 18:
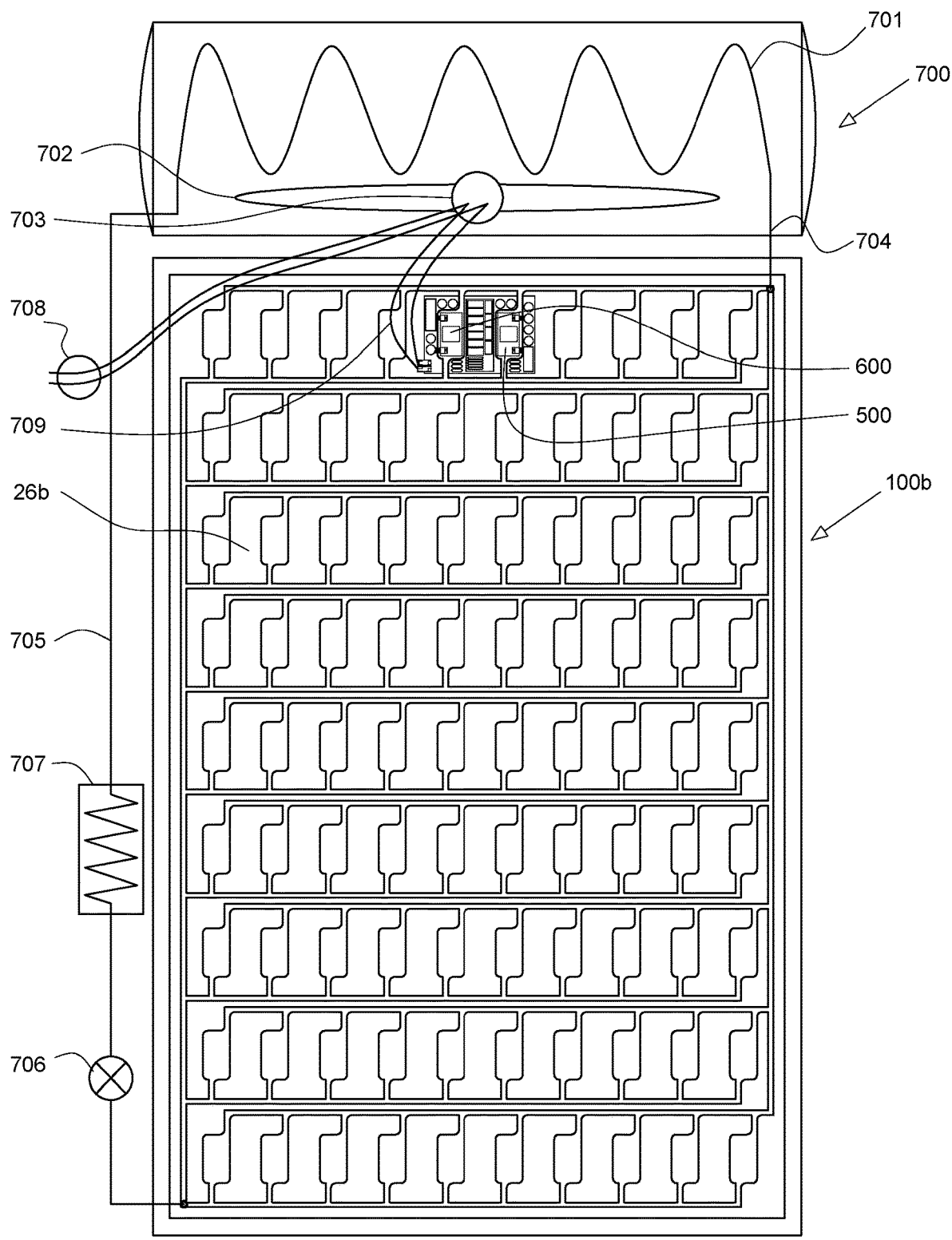
FIG. 18 depicts the cooling arrangement heat exchanger for the solar hot water unit of FIG. 16.

As shown in FIGS. 16 to 18, a "solar thermal hot water unit" comprises a hot water tank 700, a photovoltaic thermal solar panel 100b and a supporting frame structure 710.

Solar panel 100b has a heat exchanger 26b, similar to heat exchanger 26a described earlier, to provide cooling of photovoltaic cells 38b and for cooling a MPPT circuitry 600 and DC/AC inverter circuitry 500.

Also incorporated inside hot water tank 700 is another (second) heat exchanger 701 and electrical heating element 702 of heater 703, which is connected via 708 to the mains power AC grid in conjunction with MPPT circuitry 600 and inverter 500, which supplies mains AC electrical power in communication with mains grid cables 708 via link cables 709. When electrical heating element 702 is in service (switched on) high voltage AC power is supplied via main grid connection cable 708 and MPPT circuitry 600 and inverter 500 via connection cable 709. When water heating element 702 is switched off, high voltage AC electricity from MPPT circuitry 600 and inverter 500 is then connected directly to the external high voltage AC grid via grid connection 708, 709. Further thermal heating assistance of the water in tank 700 is provided by heated circulated coolant delivered from heat exchanger 26b.

The coolant is circulated throughout the cooling system via pump 706 and a further external cooling mechanism (a third heat exchanger) 707 is employed. Preferably, heat exchanger 707 and pump 706 is positioned in the return coolant line 705.

Whilst in the abovementioned embodiments described with reference to FIGS. 14 to 18, both MPPT circuitry 600 and DC/AC inverter circuitry 500 are described in combination, it should be understood that one or the other may be used separately in the cooling solutions proposed. By this we mean that either or both of these circuitries could be cooled by the same heat exchanger arrangement being employed to cool solar panels.

The present invention allows for the placement of MPPT circuitry 600 and DC/AC inverter 500, either in combination or alone at the solar panel.

The terms "comprising" and "including" (and their grammatical variations) as used herein are used in inclusive sense and not in the exclusive sense of "consisting only of".

The invention claimed is:

1. A modular unit for attachment to a solar panel having a plurality of photovoltaic cells, said modular unit comprising:
 a heat exchanger having an inlet manifold and an outlet manifold; and a MPPT device alone or in combination with a DC/AC inverter to be directly connected directly to said panel and a plurality of first heat sink tiles arranged in a grid array with expansion gaps there between;
 wherein each of said first heat sink tiles having a coolant side in contact with said first heat exchanger and an opposed bonding side for direct thermal contact with a respective one of said photovoltaic cells, and said heat exchanger having a plurality of first coolant chambers disposed adjacent to said first heat sink tiles, and each of said first heat sink tiles has at least one of said plurality of first coolant chambers respectively associated therewith, and said heat exchanger has at least one second coolant chamber disposed adjacent to said MPPT device alone or in combination with a DC/AC inverter,
 wherein the MPPT device and/or the DC/AC inverter are disposed in a housing integrally formed in said heat exchanger.

2. A modular unit as claimed in claim 1, wherein a second heat sink is disposed between each of said second coolant chambers and said MPPT device and/or DC/AC inverter.

3. A modular unit as claimed in claim 1, wherein said heat exchanger has a plurality of inlet galleries and outlet galleries in fluid communication between said first coolant chambers and said inlet manifold and outlet manifold, and said inlet galleries and said outlet galleries are spaced apart from said first heat sink tiles.

4. A modular unit as claimed in claim 3, wherein said inlet galleries are adapted to deliver a coolant fluid to said first coolant chambers from an inlet manifold in parallel at substantially the same temperature.

5. A modular unit as claimed in claim 1, wherein said modular unit is connected to a circulation system, and a pump disposed in said circulation system is operably adapted to circulate a coolant fluid through said heat exchanger.

6. A modular unit as claimed in claim 1, wherein said MPPT device and/or inverter is operably connected to a hot water system comprising at least one water tank having at least one heating element for heating water, and electricity generated by said panel is supplied to said at least one heating element.

7. A modular unit as claimed in claim 6, wherein energy in circulating coolant delivered from said heat exchanger is used to provide thermal assistance to heating water in said at least one water tank.

* * * * *